United States Patent
Miyamoto et al.

(10) Patent No.: US 11,561,653 B2
(45) Date of Patent: Jan. 24, 2023

(54) CONTROL CIRCUITRY, ELECTRONIC DEVICE, AND METHOD FOR CONTROLLING ELECTRONIC DEVICE

(71) Applicant: FUJITSU LIMITED, Kawasaki (JP)

(72) Inventors: Akinori Miyamoto, Sagamihara (JP); Kiyoshi Taninaka, Ebina (JP); Yuichi Kamata, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/805,737

(22) Filed: Feb. 29, 2020

(65) Prior Publication Data

US 2020/0201461 A1 Jun. 25, 2020

Related U.S. Application Data

(63) Continuation of application No. PCT/JP2017/032698, filed on Sep. 11, 2017.

(51) Int. Cl.
*G06F 3/044* (2006.01)
*G06F 3/01* (2006.01)
(Continued)

(52) U.S. Cl.
CPC ............. *G06F 3/044* (2013.01); *G06F 3/016* (2013.01); *H01L 41/042* (2013.01); *H01L 41/1132* (2013.01)

(58) Field of Classification Search
CPC ........ G06F 3/044; G06F 3/016; G06F 3/0414; G06F 3/041; H01L 41/042; H01L 41/1132; H01L 41/09; G01L 1/16
See application file for complete search history.

(56) References Cited

U.S. PATENT DOCUMENTS 6,347,555 B1 * 2/2002 Namerikawa ............. G01L 1/18
73/760
2007/0103449 A1 5/2007 Laitinen et al.
(Continued)

FOREIGN PATENT DOCUMENTS

EP 3065029 A1 9/2016
JP 2006-107140 4/2006
(Continued)

OTHER PUBLICATIONS

The extended European search report of European Patent Application No. 17924676.4 dated Jul. 30, 2020.
(Continued)

*Primary Examiner* — Temesghen Ghebretinsae
*Assistant Examiner* — Karin Kiyabu
(74) *Attorney, Agent, or Firm* — Maschoff Brennan

(57) ABSTRACT

A control device that controls an electronic device including a top panel having an operation surface, a position detector that detects a position of operational input performed on the operation surface, and a first vibrating element that generates vibration in the top panel, the control device includes a first processor that outputs a first drive signal to the first vibrating element to drive the first vibrating element; a first capacitor inserted in series between the first vibrating element and the first processor; and a first differential amplifier that detects a first voltage of the first capacitor or the first vibrating element, wherein the first processor is configured to determine whether pressing operation to the top panel has been performed based on the first voltage detected by the first differential amplifier.

15 Claims, 27 Drawing Sheets

(51) Int. Cl.
  *H01L 41/04*   (2006.01)
  *H01L 41/113*  (2006.01)

(56) References Cited

U.S. PATENT DOCUMENTS

| | | | |
|---|---|---|---|
| 2009/0146533 A1 | 6/2009 | Leskinen et al. | |
| 2012/0154318 A1 | 6/2012 | Aono | |
| 2013/0336035 A1* | 12/2013 | Ramabhadran | H02M 7/797 363/131 |
| 2014/0331791 A1 | 11/2014 | Ishii et al. | |
| 2015/0160771 A1* | 6/2015 | Takeuchi | G06F 3/041 345/177 |
| 2016/0117035 A1 | 4/2016 | Watazu et al. | |
| 2016/0202764 A1* | 7/2016 | Kamata | G06F 3/04883 715/702 |
| 2021/0055832 A1* | 2/2021 | Bagheri | G06F 3/041661 |

FOREIGN PATENT DOCUMENTS

| | | | |
|---|---|---|---|
| JP | 2011-048696 | | 3/2011 |
| JP | 2014-238267 | | 12/2014 |
| JP | 2016-080549 | | 5/2016 |
| JP | 2017-4262 | | 1/2017 |
| JP | 2017-16510 | | 1/2017 |
| WO | 2013-014942 | * | 1/2013 |
| WO | 2013/014942 | | 1/2013 |
| WO | 2013/111841 | | 8/2013 |

OTHER PUBLICATIONS

English Translation of the International Search Report for international application No. PCT/JP2017/032698 dated Oct. 31, 2017.
Written Opinion for international application No. PCT/JP2017/032698 dated Oct. 23, 2017.
European Office Action dated Oct. 29, 2021 as received in application No. 17924676.4.

* cited by examiner

FIG. 7

| APPLICATION ID | AREA DATA | VIBRATION PATTERN |
|---|---|---|
| 1 | f1=(X,Y) | P1 |
| 1 | f2=(X,Y) | P2 |
| 1 | f3=(X,Y) | P3 |
| 1 | f4=(X,Y) | P4 |
| 1 | f5=(X,Y) | P5 |

FIG. 12

| Vth (1,1) | Vth (1,2) | Vth (1,3) | Vth (1,4) | Vth (1,5) | Vth (1,6) | Vth (1,7) | Vth (1,8) |
| Vth (2,1) | Vth (2,2) | Vth (2,3) | Vth (2,4) | Vth (2,5) | Vth (2,6) | Vth (2,7) | Vth (2,8) |
| Vth (3,1) | Vth (3,2) | Vth (3,3) | Vth (3,4) | Vth (3,5) | Vth (3,6) | Vth (3,7) | Vth (3,8) |
| Vth (4,1) | Vth (4,2) | Vth (4,3) | Vth (4,4) | Vth (4,5) | Vth (4,6) | Vth (4,7) | Vth (4,8) |
| Vth (5,1) | Vth (5,2) | Vth (5,3) | Vth (5,4) | Vth (5,5) | Vth (5,6) | Vth (5,7) | Vth (5,8) |

CONTROL CIRCUITRY, ELECTRONIC DEVICE, AND METHOD FOR CONTROLLING ELECTRONIC DEVICE

CROSS-REFERENCE TO RELATED APPLICATION

This application is a continuation application of International Application PCT/JP2017/032698 filed on Sep. 11, 2017 and designated the U.S., the entire contents of which are incorporated herein by reference.

FIELD

The embodiment discussed herein is related to a control device, an electronic device, and a method for controlling the electronic device.

BACKGROUND

There is conventionally an operation device including an operation unit on which tracing operation is performed in a predetermined operation range, an excitation unit that applies vibration for tactile presentation to the operation unit, and a housing that supports the operation unit so that the operation unit can be vibrated under a predetermined vibration condition depending on application of vibration by the excitation unit.

The operation device further includes a control unit that generates a drive signal for driving the excitation unit under the predetermined vibration condition, and a load detection unit that detects an operation load when tracing operation is performed on the operation unit, and the control unit controls the operation load at the time of the tracing operation to be constant by controlling output intensity of the drive signal on the basis of an output of the load detection unit. As related art, Japanese Laid-open Patent Publication No. 2017-004262 is disclosed.

By the way, the conventional operation device includes the load detection unit that detects the operation load when the operation is performed. To detect the operation, the load detection unit is provided on a connection member between the operation unit having a panel shape and the housing.

A strain gauge is used as the load detection unit, and the connection member between the operation unit and the housing is a portion exposed to the outside of the operation device, so that a dedicated installation space is necessary on the outer surface of the operation device, and there is a problem that the configuration of the operation device (control device) is not simple. In view of the above, it is desirable to be able to provide a control device and an electronic device each having a simple configuration, and a method for controlling the electronic device.

SUMMARY

According to an aspect of the embodiments, a control device that controls an electronic device including a top panel having an operation surface, a position detector that detects a position of operational input performed on the operation surface, and a first vibrating element that generates vibration in the top panel, the control device includes a first processor that outputs a first drive signal to the first vibrating element to drive the first vibrating element; a first capacitor inserted in series between the first vibrating element and the first processor; and a first differential amplifier that detects a first voltage of the first capacitor or the first vibrating element, wherein the first processor is configured to determine whether pressing operation to the top panel has been performed based on the first voltage detected by the first differential amplifier.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a table illustrating data to be stored in a memory;

FIG. 12 is a table illustrating a database of determination threshold values;

DESCRIPTION OF EMBODIMENTS

Hereinafter, an embodiment will be described to which a control device, an electronic device, and a method for controlling the electronic device according to the present embodiment are applied.

Embodiment

Figure 1:
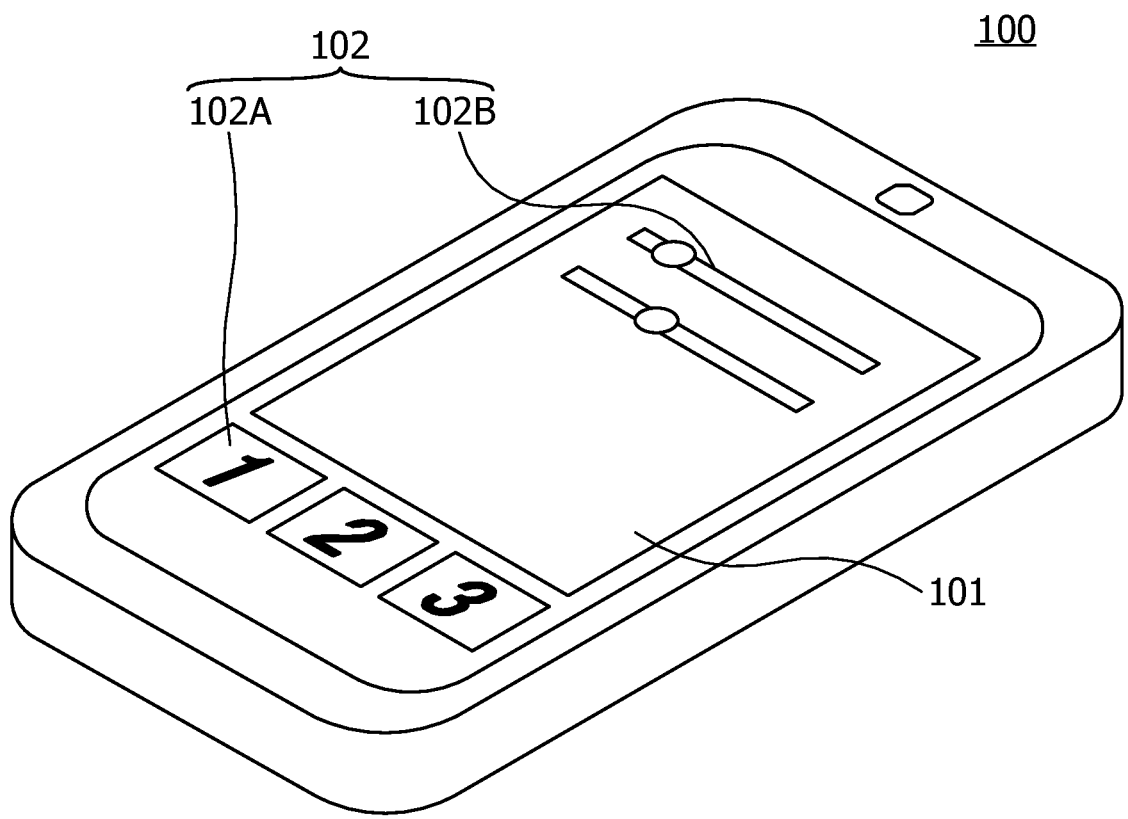
FIG. 1 is a perspective view illustrating an electronic device according to an embodiment.

FIG. 1 is a perspective view illustrating an electronic device 100 according to an embodiment.

The electronic device 100 is, for example, a smartphone terminal or a tablet computer using a touch panel as an input operation unit. Since it is sufficient that the electronic device 100 is a device using a touch panel as an input operation unit, it may be, for example, a mobile information terminal, or a device installed and used at a specific place, such as an automatic teller machine (ATM).

The electronic device 100 includes an input operation unit 101 in which a display panel is disposed below the touch panel, and various buttons 102A, sliders 102B, and the like using a graphic user interface (GUI) (hereinafter referred to as a GUI operation unit 102) are displayed on the display panel.

A user of the electronic device 100 normally touches the input operation unit 101 with the user's fingertip to operate the GUI operation unit 102.

Next, a specific configuration of the electronic device 100 will be described with reference to FIG. 2.

Figure 2:
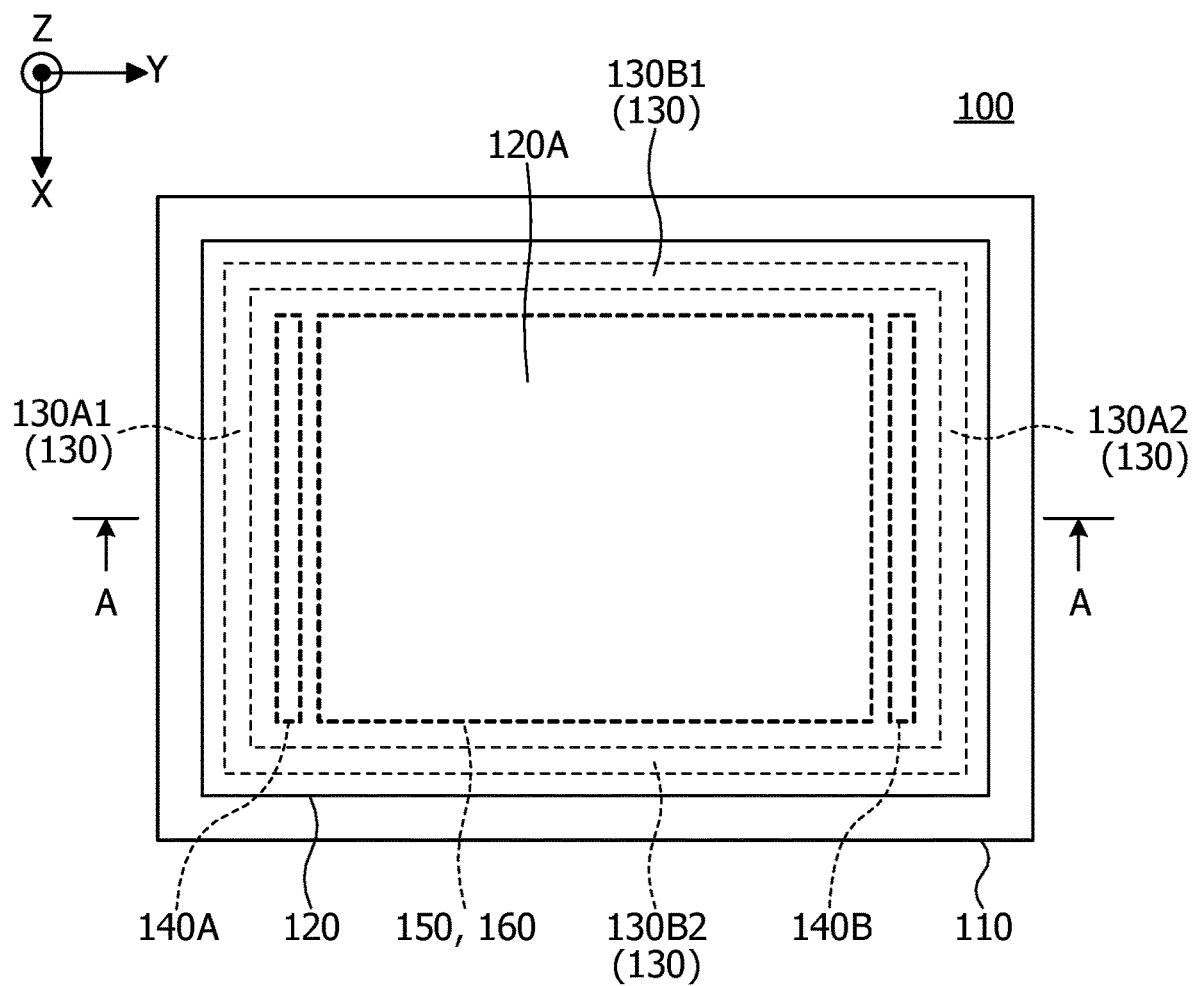
FIG. 2 is a plan view illustrating the electronic device according to the embodiment.
Figure 3:
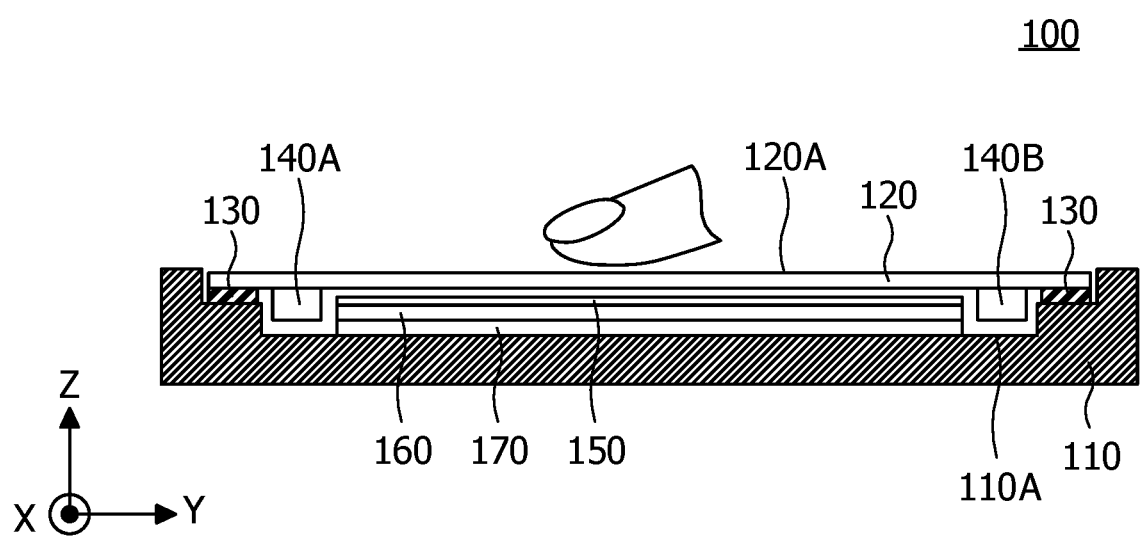
FIG. 3 is a diagram illustrating a cross section taken along a line A-A of the electronic device illustrated in FIG. 2.

FIG. 2 is a plan view illustrating the electronic device 100 according to the embodiment, and FIG. 3 is a diagram illustrating a cross section taken along a line A-A of the electronic device 100 illustrated in FIG. 2. Note that, an XYZ coordinate system is defined that is an orthogonal coordinate system as illustrated in FIGS. 2 and 3.

The electronic device 100 includes a housing 110, a top panel 120, a double-sided tape 130, vibrating elements 140A and 140B, a touch panel 150, a display panel 160, and a substrate 170.

The housing 110 is made of, for example, resin, and as illustrated in FIG. 3, the substrate 170, the display panel 160, and the touch panel 150 are disposed in a recess 110A, and the top panel 120 is bonded by the double-sided tape 130.

The top panel 120 is a thin tabular member that is rectangular in a plan view, and is made of transparent glass or reinforced plastic such as polycarbonate. A surface 120A (surface on a Z-axis positive direction side) of the top panel 120 is an example of an operation surface on which the user of the electronic device 100 performs operational input.

On the top panel 120, the vibrating elements 140A and 140B are bonded to a surface on the Z-axis negative direction side, and four sides in a plan view are bonded to the housing 110 by the double-sided tape 130. Note that, the double-sided tape 130 is only required to be capable of bonding the four sides of the top panel 120 to the housing 110, and does not have to be a rectangular ring as illustrated in FIG. 3.

The touch panel 150 is disposed on the Z-axis negative direction side of the top panel 120. The top panel 120 is provided to protect the surface of the touch panel 150. Note that, another panel, a protective film, or the like may be further provided on the surface 120A of the top panel 120.

The vibrating elements 140A and 140B are driven in a state where the vibrating elements 140A and 140B are bonded to the surface on the Z-axis negative direction side, whereby the top panel 120 vibrates. In the embodiment, the top panel 120 is vibrated at the natural vibration frequency of the top panel 120 to generate a standing wave in the top panel 120. However, since the vibrating elements 140A and 140B are bonded to the top panel 120, it is practically preferable to determine the natural vibration frequency in consideration of the weight of the vibrating elements 140A and 140B, and the like.

The vibrating element 140A is bonded to the surface on the Z-axis negative direction side of the top panel 120, along the short side extending in the X-axis direction on the Y-axis negative direction side. The vibrating element 140B is bonded to the surface on the Z-axis negative direction side of the top panel 120, along the short side extending in the X-axis direction on the Y-axis positive direction side. It is sufficient that the vibrating elements 140A and 140B are elements capable of generating vibration in the ultrasonic band, and for example, an element can be used including a piezoelectric element, such as a piezo element.

The double-sided tape 130 bonds the top panel 120 to the housing 110. The double-sided tape 130 is provided outside the touch panel 150 and the display panel 160 in a plan view.

The double-sided tape 130 that is rectangular in a plan view has four tape portions 130A1, 130A2, 130B1, and 130B2. The tape portion 130A1 is a linear portion extending along the X-axis on the Y-axis negative direction side of the top panel 120. The tape portion 130A2 is a linear portion extending along the X-axis on the Y-axis positive direction side of the top panel 120. The tape portion 130B1 is a linear portion extending along the Y-axis on the X-axis negative direction side of the top panel 120. The tape portion 130B2 is a linear portion extending along the Y-axis on the X-axis positive direction side of the top panel 120.

In the top panel 120, a standing wave is generated whose amplitude changes along the Y-axis direction. Not to attenuate the vibration of the standing wave, the tape portions 130A1 and 130A2 have a lower Young's modulus and are softer than the tape portions 130B1 and 130B2. The tape portions 130A1, 130A2, 130B1, and 130B2 may be divided into four or may be integrated together.

The vibrating elements 140A and 140B are driven by a first drive signal and a second drive signal output from a drive control unit to be described later. The frequencies and amplitudes of the first drive signal and the second drive signal are equal to each other.

Here, for example, the vibrating elements 140A and 140B are disposed to be axially symmetric with respect to a center line parallel to the two short sides of the top panel 120, as the axis of symmetry. It is assumed that a portion where the vibrating element 140A is attached to the top panel 120 and a portion where the vibrating element 140B is attached to the top panel 120 are, for example, portions of antinodes of the natural vibration generated in the top panel 120, and portions that vibrate in the same phase. In this case, the first drive signal and the second drive signal are drive signals in the same phase.

The amplitude (intensity) and the frequency of the vibration generated by the vibrating elements 140A and 140B are set by the first drive signal and the second drive signal. Furthermore, the on/off of the vibrating elements 140A and 140B are controlled by the first drive signal and the second drive signal, respectively.

Note that, the ultrasonic band refers to, for example, a frequency band higher than or equal to about 20 kHz. In the electronic device 100 according to the embodiment, since the frequency at which the vibrating elements 140A and 140B vibrate is equal to the frequency of the top panel 120, the vibrating elements 140A and 140B are driven by the first drive signal and the second drive signal to vibrate at the natural frequency of the top panel 120.

The touch panel 150 is disposed on the display panel 160 (Z-axis positive direction side) and under the top panel 120 (Z-axis negative direction side). The touch panel 150 is an example of a coordinate detection unit that detects a position (hereinafter referred to as a position of operational input) at which the user of the electronic device 100 touches the top panel 120.

Various buttons and the like using the GUI (hereinafter referred to as GUI operation unit) are displayed on the display panel 160 under the touch panel 150. For this reason, the user of the electronic device 100 normally touches the top panel 120 with the user's fingertip to operate the GUI operation unit.

The touch panel 150 is only required to be a coordinate detection unit capable of detecting the position of the operational input to the top panel 120 by the user, and is only required to be, for example, a coordinate detection unit of a capacitance type or a resistive film type. Here, a mode will be described in which the touch panel 150 is a coordinate detection unit of a capacitance type. The touch panel 150 of a capacitance type can detect operational input to the top panel 120 even if there is a gap between the touch panel 150 and the top panel 120.

Furthermore, here, although a mode will be described in which the top panel 120 is disposed on the input surface side of the touch panel 150, the top panel 120 may be integrated with the touch panel 150. In this case, the surface of the touch panel 150 serves as the surface of the top panel 120 illustrated in FIGS. 2 and 3, which constitutes the operation surface. Furthermore, the top panel 120 illustrated in FIGS. 2 and 3 may be omitted in the configuration. Also in this case, the surface of the touch panel 150 constitutes the operation surface. Furthermore, in this case, it is sufficient that a member having the operation surface is vibrated by the natural vibration of the member.

Furthermore, in a case where the touch panel 150 is of a resistive film type, the touch panel 150 may be disposed on the top panel 120. Also in this case, the surface of the touch panel 150 constitutes the operation surface. Furthermore, in a case where the touch panel 150 is of a capacitance type, the top panel 120 illustrated in FIGS. 2 and 3 may be omitted in the configuration. Also in this case, the surface of the touch panel 150 constitutes the operation surface. Furthermore, in this case, it is sufficient that a member having the operation surface is vibrated by the natural vibration of the member.

The display panel 160 is only required to be a display unit capable of displaying an image, for example, a liquid crystal display panel, an organic electroluminescence (EL) panel, or the like. The display panel 160 is installed on the substrate 170 (Z-axis positive direction side) with a holder or the like (not illustrated) inside the recess 110A of the housing 110.

In the display panel 160, drive control is performed by a driver integrated circuit (IC) to be described later, and the GUI operation unit, an image, a character, a symbol, a figure, and the like are displayed depending on the operation status of the electronic device 100.

The substrate 170 is disposed inside the recess 110A of the housing 110. The display panel 160 and the touch panel 150 are disposed on the substrate 170. The display panel 160 and the touch panel 150 are fixed to the substrate 170 and the housing 110 with a holder or the like (not illustrated).

In addition to the control device to be described later, various circuits and the like necessary for driving the electronic device 100 are mounted on the substrate 170.

In the electronic device 100 having a configuration as described above, when the user's finger is in contact with the top panel 120 and movement of the fingertip is detected, the drive control unit mounted on the substrate 170 drives the vibrating elements 140A and 140B to generate vibration representing a tactile sensation depending on a position of the fingertip, and vibrates the top panel 120 at a frequency in the ultrasonic band. The frequency in the ultrasonic band is a resonant frequency of a resonance system including the top panel 120 and the vibrating elements 140A and 140B, which generates a standing wave in the top panel 120.

Furthermore, when detecting that the user's finger is in contact with the top panel 120 and the fingertip is not moved, the electronic device 100 drives the vibrating elements 140A and 140B to generate a vibration whose amplitude is constant and does not change, and vibrates the top panel 120 at a frequency in the ultrasonic band. The frequency in the ultrasonic band is the same as that in a case where the movement of the fingertip is detected.

The electronic device 100 generates the standing wave in the ultrasonic band, thereby providing the tactile sensation to the user through the top panel 120. Note that, here, although a mode will be described in which the electronic device 100 includes the two vibrating elements 140A and 140B, the electronic device 100 may include any one of the vibrating elements 140A and 140B.

Next, the standing wave to be generated in the top panel 120 will be described with reference to FIGS. 4A and 4B.

Figure 4A:
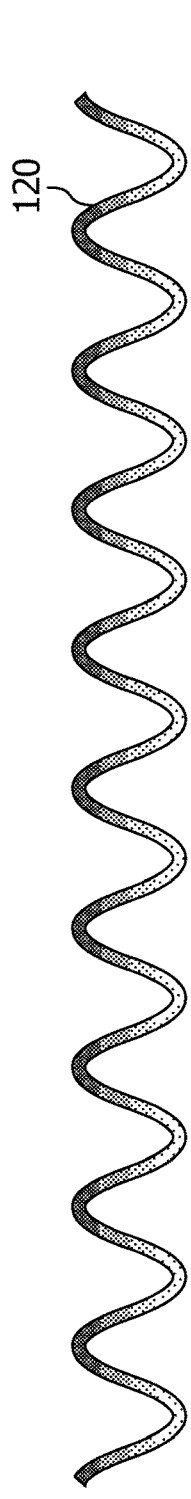
FIGS. 4A and 4B each are a diagram illustrating a wave crest formed in parallel to the short side of a top panel in a standing wave generated in the top panel by natural vibration in the ultrasonic band.
Figure 4B:
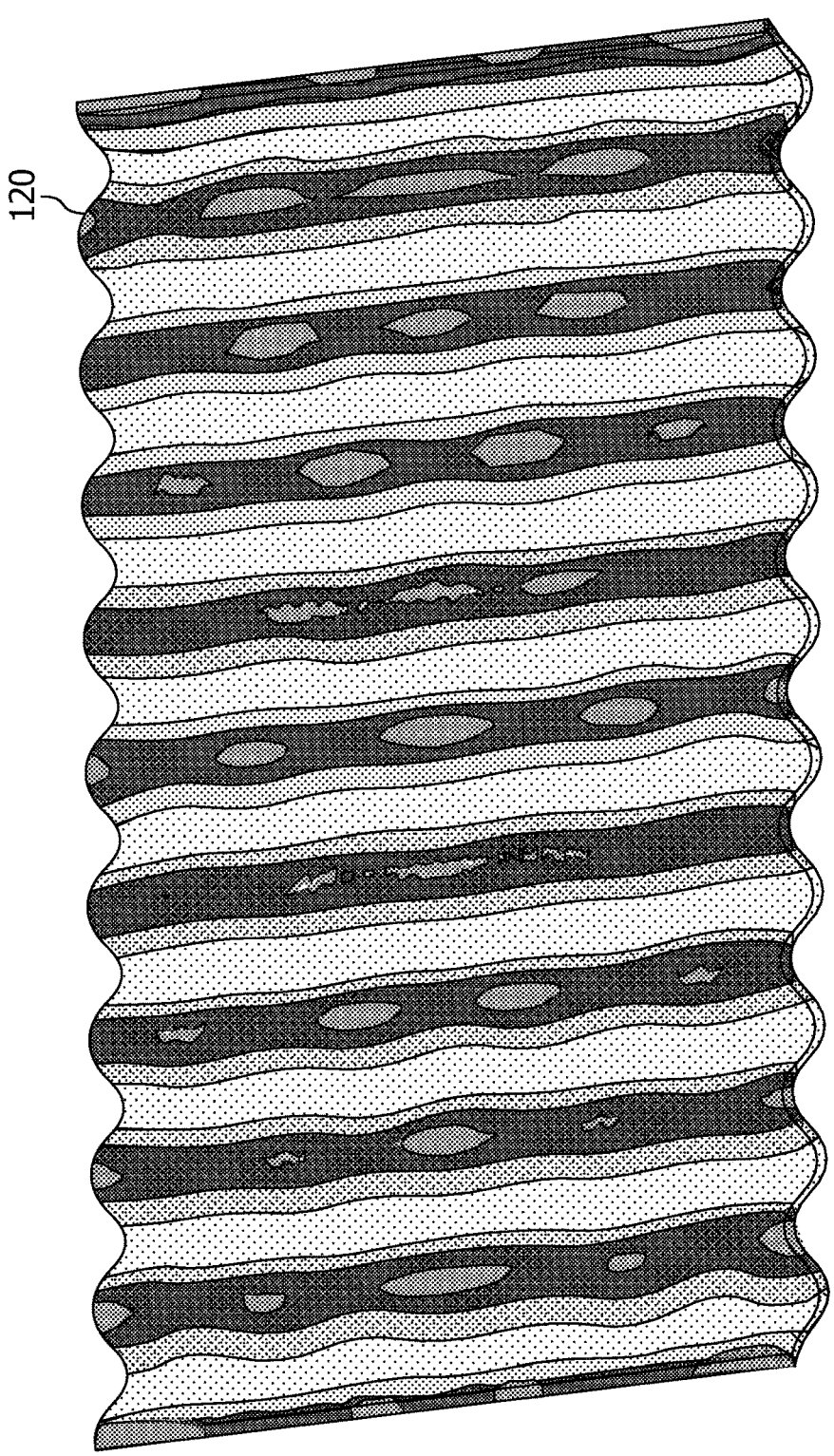

FIGS. 4A and 4B each are a diagram illustrating a wave crest formed in parallel to the short side of the top panel 120 in the standing wave generated in the top panel 120 by natural vibration in the ultrasonic band. FIG. 4A is a side view, and FIG. 4B is a perspective view. FIGS. 4A and 4B each illustrate the standing wave in the ultrasonic band generated in the top panel 120 in a case where the vibrating elements 140A and 140B are driven by the first drive signal and the second drive signal. In FIGS. 4A and 4B, an XYZ coordinate is defined similar to that in FIGS. 2 and 3. Note that, FIGS. 4A and 4B each illustrate the amplitude of the standing wave exaggeratedly for easy understanding. Furthermore, the vibrating elements 140A and 140B are omitted in FIGS. 4A and 4B.

A natural frequency (resonant frequency) f of the top panel 120 is expressed by the following formulas (1) and (2) using a Young's modulus E, a density p, a Poisson's ratio δ, a long side dimension I, a thickness t of the top panel 120, and the number of cycles k of the standing wave existing in a long side direction. Since the standing wave has the same waveform in units of ½ cycles, the number of cycles k takes values in increments of 0.5, which is 0.5, 1, 1.5, 2, and so on.

[Formula 1]

$$f = \frac{\pi k^2 t}{l^2} \sqrt{\frac{E}{3\rho(1-\delta^2)}} \quad (1)$$

[Formula 2]

$$f = \alpha k^2 \quad (2)$$

Note that, a coefficient α in the formula (2) is a collective expression of coefficients other than $k^2$ in the formula (1).

For example, the standing waves illustrated in FIGS. 4A and 4B are waveforms in a case where the number of cycles k is 10. In a case where Gorilla (registered trademark) glass having a long side length L of 140 mm, a short side length of 80 mm, and the thickness t of 0.7 mm is used as the top panel 120, for example, the natural frequency f is 33.5 kHz in the case where the number of cycles k is 10. In this case, it is sufficient that the first drive signal and the second drive signal are used having a frequency of 33.5 kHz.

The top panel 120 is a tabular member, and when the vibrating elements 140A and 140B (see FIGS. 2 and 3) are driven to generate the natural vibration in the ultrasonic band, the surface 120A is bent as illustrated in FIGS. 4A and 4B, whereby the standing wave is generated in the surface 120A.

Here, a mode will be described in which the portion where the vibrating element 140A is attached to the top panel 120 and the portion where the vibrating element 140B is attached to the top panel 120 are, for example, portions of antinodes of the natural vibration generated in the top panel 120, and portions that vibrate in the same phase.

For this reason, the number of cycles k is an integer. Note that, in a case where the number of cycles k is a decimal (a number including an integer part and a decimal part), the portion where the vibrating element 140A is attached to the top panel 120 and the portion where the vibrating element 140B is attached to the top panel 120 are portions of antinodes of the natural vibration that vibrate in opposite phases, so that it is sufficient that the vibrating element 140A and the vibrating element 140B are driven in opposite phases.

Next, the natural vibration in the ultrasonic band generated in the top panel 120 of the electronic device 100 will be described with reference to FIGS. 5A and 5B.

Figure 5B:
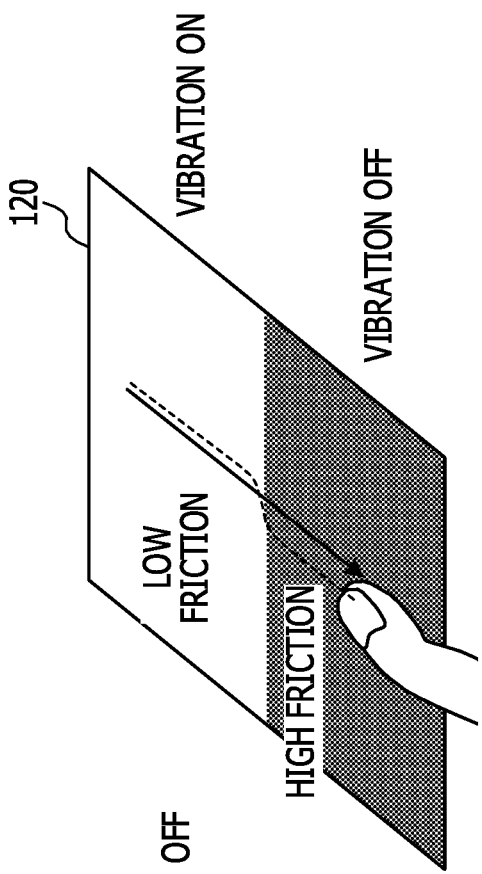
FIGS. 5A and 5B each are a diagram illustrating a state in which dynamic friction force applied to a fingertip performing operational input changes due to the natural vibration in the ultrasonic band generated in the top panel of the electronic device.
Figure 5A:
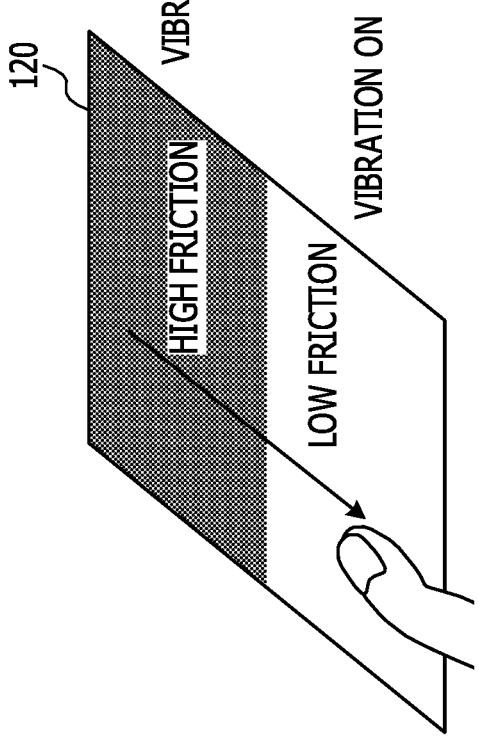

FIGS. 5A and 5B each are a diagram illustrating a state in which dynamic friction force applied to a fingertip performing operational input changes due to the natural vibration in the ultrasonic band generated in the top panel 120 of the electronic device 100. In FIGS. 5A and 5B, the user is performing, while touching the top panel 120 with the fingertip, operational input of moving the finger along the arrow from the far side to the near side of the top panel 120.

Here, for easy understanding, a case will be described in which the dynamic friction force is changed by switching on/off of the vibration. Note that, on/off of the vibration is performed by turning on/off the vibrating elements 140A and 140B (see FIGS. 2 and 3).

Furthermore, in FIGS. 5A and 5B, the range touched by the finger while the vibration is off is illustrated in gray, and the range touched by the finger while the vibration is on is illustrated in white in the depth direction of the top panel 120.

While the natural vibration in the ultrasonic band is generated in the entire top panel 120 as illustrated in FIGS. 4A and 4B, FIGS. 5A and 5B illustrate operation patterns of switching on/off of the vibration while the user's finger moves from the far side to the near side of the top panel 120.

For this reason, in FIGS. 5A and 5B, the range touched by the finger while the vibration is off is illustrated in gray, and the range touched by the finger while the vibration is on is illustrated in white in the depth direction of the top panel 120.

In the operation pattern illustrated in FIG. 5A, the vibration is off when the user's finger is on the far side of the top panel 120, and the vibration is turned on while the finger moves to the near side.

On the other hand, in the operation pattern illustrated in FIG. 5B, the vibration is on when the user's finger is on the far side of the top panel 120, and the vibration is turned off while the finger moves to the near side.

Here, when the natural vibration in the ultrasonic band is generated in the top panel 120, an air layer due to squeeze effect is interposed between the surface 120A of the top panel 120 and the finger, and a dynamic friction coefficient of when the finger traces the surface 120A of the top panel 120 decreases.

Thus, in FIG. 5A, the dynamic friction force applied to the fingertip is large in the range illustrated in gray on the far side of the top panel 120, and the dynamic friction force applied to the fingertip is small in the range illustrated in white on the near side of the top panel 120.

For this reason, as illustrated in FIG. 5A, the user who performs operational input to the top panel 120 senses a decrease in the dynamic friction force applied to the fingertip when the vibration is turned on, and perceives the ease of slipping of the fingertip. At this time, with the surface 120A of the top panel 120 being smoother, the user feels that a recess exists on the surface 120A of the top panel 120 when the dynamic friction force decreases.

On the other hand, in FIG. 5B, the dynamic friction force applied to the fingertip is small in the range illustrated in white on the far side of the top panel 120, and the dynamic friction force applied to the fingertip is large in the range illustrated in gray on the near side of the top panel 120.

For this reason, as illustrated in FIG. 5B, the user who performs operational input to the top panel 120 senses an increase in the dynamic friction force applied to the fingertip when the vibration is turned off, and perceives the difficulty of slipping of the fingertip or the feeling of being caught. Then, due to the difficulty of slipping of the fingertip, the user feels that a protrusion exists on the surface 120A of the top panel 120 when the dynamic friction force increases.

From the above, the user can feel the unevenness with the fingertip in the case of FIGS. 5A and 5B. The fact that a person perceives the unevenness as described above is described in, for example, "Print Transfer Method for Tactile Design and Sticky-band Illusion" (Papers of 11th Annual Conference of the Society of Instrument and Control Engineers (SICE) System Integration Division (SI2010, Sendai), 174-177, 2010-12). Furthermore, it is also described in "Fishbone Tactile Illusion" (Papers of 10th Annual Conference of the Virtual Reality Society of Japan (VRSJ) (September 2005)).

Note that, here, although the change in the dynamic friction force has been described in a case where on/off of the vibration is switched, the same applies to a case where the amplitude (intensity) of the vibrating elements 140A and 140B are changed.

Next, a configuration of the electronic device 100 according to the embodiment will be described with reference to FIG. 6.

Figure 6:
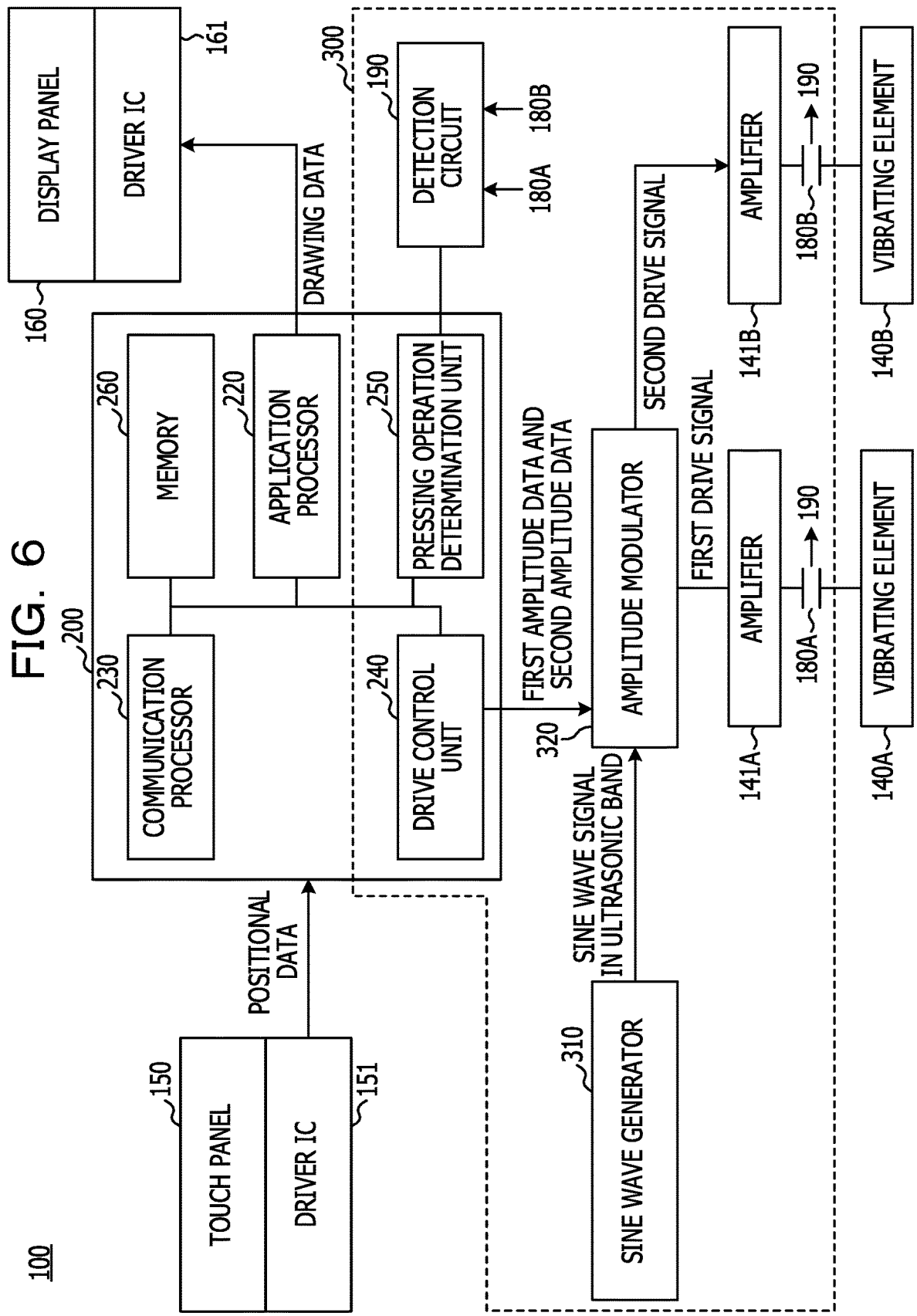
FIG. 6 is a diagram illustrating a configuration of the electronic device according to the embodiment.

FIG. 6 is a diagram illustrating a configuration of the electronic device 100 according to the embodiment.

The electronic device 100 includes the vibrating elements 140A and 140B, amplifiers 141A and 141B, the touch panel 150, a driver integrated circuit (IC) 151, the display panel 160, a driver IC 161, capacitors 180A and 180B, a detection circuit 190, a control unit 200, a sine wave generator 310, and an amplitude modulator 320.

The control unit 200 includes an application processor 220, a communication processor 230, a drive control unit 240, a pressing operation determination unit 250, and a memory 260. The control unit 200 is implemented by, for example, an IC chip.

Furthermore, the capacitors 180A and 180B, the detection circuit 190, the drive control unit 240, the pressing operation determination unit 250, the sine wave generator 310, and the amplitude modulator 320 constitute a control device 300. Note that, here, a mode will be described in which the application processor 220, the communication processor 230, the drive control unit 240, the pressing operation determination unit 250, and the memory 260 are implemented by the one control unit 200; however, the drive control unit 240 may be separately provided as another IC chip or processor outside the control unit 200. In this case, it is sufficient that, among data stored in the memory 260, data necessary for the drive control of the drive control unit 240 is stored in a memory different from the memory 260 and provided inside the control device 300.

In FIG. 6, the housing 110, the top panel 120, the double-sided tape 130, and the substrate 170 (see FIG. 2) are omitted. Furthermore, here, a description will be given of the amplifiers 141A and 141B, the driver IC 151, the driver IC 161, the capacitors 180A and 180B, the detection circuit 190, the drive control unit 240, the pressing operation determination unit 250, the memory 260, the sine wave generator 310, and the amplitude modulator 320.

The amplifier 141A is connected to the control device 300 and is connected to the vibrating element 140A via the capacitor 180A, and amplifies the first drive signal output from the control device 300 to drive the vibrating element 140A. The amplifier 141B is connected to the control device 300 and is connected to the vibrating element 140B via the capacitor 180B, and amplifies the second drive signal output from the control device 300 to drive the vibrating element 140B.

The driver IC 151 is connected to the touch panel 150, detects positional data representing a position at which operational input to the touch panel 150 has been made, and outputs the positional data to the control unit 200. As a result, the positional data is input to the application processor 220 and the drive control unit 240. Note that, inputting positional data to the drive control unit 240 is equivalent to inputting positional data to the control device 300.

The driver IC 161 is connected to the display panel 160, inputs drawing data output from the control device 300 to the display panel 160, and causes the display panel 160 to display an image based on the drawing data. Therefore, the GUI operation unit, the image, or the like based on the drawing data is displayed on the display panel 160.

The capacitor 180A is inserted in series between the amplifier 141A and the vibrating element 140A, and the capacitor 180B is inserted in series between the amplifier 141B and the vibrating element 140B. The capacitors 180A and 180B are used for detecting pressing operation performed on the top panel 120. The capacitors 180A and 180B are examples of a first capacitor and a second capacitor, respectively.

The pressing operation is operation in which the user presses the surface 120A of the top panel 120 without moving the fingertip in a state where the fingertip is in contact with the surface 120A of the top panel 120. Such pressing operation is used, for example, as operation for confirming the input content. For example, in a case where a predetermined GUI button is displayed on the display panel 160, when pressing operation is performed within a display area of the GUI button, it is determined by the pressing operation determination unit 250 that the pressing operation has been performed, and the application processor 220 executes a function assigned to the GUI button.

The detection circuit 190 is provided between the pressing operation determination unit 250 and the capacitors 180A and 180B, detects the voltages across the respective capacitors 180A and 180B, and amplifies and outputs the voltage values to the pressing operation determination unit 250. Details of the detection circuit 190 will be described later.

The application processor 220 has an operating system (OS) of the electronic device 100 installed therein, and performs processing for executing various applications of the electronic device 100. When it is determined by the pressing operation determination unit 250 that the pressing operation has been performed, the application processor 220 executes a function assigned to the GUI button on which the pressing operation has been performed.

The communication processor 230 executes processing necessary for the electronic device 100 to perform communication, such as 3rd generation (3G), 4th generation (4G), long term evolution (LTE), and Wi-Fi.

When providing a tactile sensation using the squeeze effect, the drive control unit 240 outputs first amplitude data and second amplitude data to the amplitude modulator 320 in a case where two predetermined conditions are met. The drive control unit 240 is an example of a first drive control unit and a second drive control unit.

The first amplitude data and the second amplitude data respectively are data representing amplitude values for adjusting the intensities of the first drive signal and the second drive signal used for driving the vibrating elements 140A and 140B when providing the tactile sensation using the squeeze effect. The first amplitude data and the second amplitude data are, for example, digital data representing the amplitude values for adjusting the intensities of the first drive signal and the second drive signal at a frequency of, for example, 350 Hz. Here, a mode will be described in which the first amplitude data and the second amplitude data are equal to each other.

The amplitude value is set depending on a degree of temporal change in the positional data. Here, as the degree of temporal change in the positional data, a speed is used at which the user's fingertip moves along the surface 120A of the top panel 120. The moving speed of the user's fingertip is calculated by the drive control unit 240 on the basis of the degree of temporal change in the positional data input from the driver IC 151.

Furthermore, when the user's fingertip moves along the surface 120A of the top panel 120, the control device 300 according to the embodiment vibrates the top panel 120 to change the dynamic friction force applied to the fingertip. Since the dynamic friction force is generated while the fingertip is moving, the drive control unit 240 vibrates the vibrating elements 140A and 140B when the moving speed becomes higher than or equal to a predetermined threshold speed. It is the first predetermined condition that the moving speed becomes higher than or equal to the predetermined threshold speed.

Thus, the amplitude values represented by the first amplitude data and the second amplitude data output from the drive control unit 240 are set to predetermined amplitude values representing the tactile sensation when the moving speed is higher than or equal to the predetermined threshold speed.

Furthermore, in a case where the position of the fingertip that performs the operational input is within a predetermined area where vibration for providing the tactile sensation using the squeeze effect is to be generated, the control device 300 according to the embodiment outputs the first amplitude data and the second amplitude data for providing the tactile sensation, to the amplitude modulator 320. It is the second predetermined condition that the position of the fingertip that performs operational input is within the predetermined area where the vibration is to be generated.

It is determined whether or not the position of the fingertip that performs operational input is within the predetermined area where the vibration is to be generated, on the basis of whether or not the position of the fingertip that performs operational input is inside the predetermined area where the vibration is to be generated.

Here, the position on the display panel 160 of an area for displaying the GUI operation unit and the image, an area representing the entire page, or the like to be displayed on the display panel 160, is specified by area data representing the area. The area data exists for all GUI operation units displayed on the display panel 160, areas for displaying an image, or areas representing the entire page in all applications.

For this reason, when it is determined, as the second predetermined condition, whether or not the position of the fingertip that performs operational input is within the predetermined area where the vibration for providing the tactile sensation is to be generated, a type of the application being activated by the electronic device 100 relates to the determination. This is because the display on the display panel 160 differs depending on the type of the application.

Furthermore, it is because a type of operational input of moving the fingertip touching the surface 120A of the top panel 120 differs depending on the type of the application. As the type of the operational input of moving the fingertip touching the surface 120A of the top panel 120, for example, there is a so-called flick operation when the GUI operation unit is operated. The flick operation is operation of moving the fingertip along the surface 120A of the top panel 120 for a relatively short distance in a manner of flicking (snapping) the surface.

Furthermore, in the case of turning a page, swipe operation is performed, for example. The swipe operation is operation of moving the fingertip along the surface 120A of the top panel 120 for a relatively long distance in a manner of sweeping the surface. The swipe operation is performed in the case of turning a photo, for example, in addition to turning the page. Furthermore, in a case where a slider (see the slider 102B in FIG. 1) is slid by the GUI operation unit, drag operation of dragging the slider is performed.

The operational inputs of moving the fingertip touching the surface 120A of the top panel 120, such as the flick operation, the swipe operation, and the drag operation given as examples here, are selectively used depending on the type of display based on the application. For this reason, when it is determined whether or not the position of the fingertip that performs operational input is within the predetermined area where the vibration is to be generated, the type of the application being activated by the electronic device 100 relates to the determination.

Using the area data, the drive control unit 240 determines whether or not the position represented by the positional data input from the driver IC 151 is inside the predetermined area where the vibration for providing the tactile sensation is to be generated.

The memory 260 stores data to be stored in the memory 260 in which data representing the type of the application, area data representing the GUI operation unit or the like on which the operational input is performed, and pattern data representing a vibration pattern are associated with each other.

The two predetermined conditions necessary for outputting the first amplitude data and the second amplitude data to the amplitude modulator 320 when the drive control unit 240 provides the tactile sensation using the squeeze effect are that the moving speed of the fingertip is higher than or equal to the predetermined threshold speed, and that coordinates representing the position of the operational input are inside the predetermined area where the vibration is to be generated.

In a case where the moving speed of the fingertip is higher than or equal to the predetermined threshold speed, and the coordinates of the operational input are inside the predetermined area where the vibration is to be generated, when providing the tactile sensation using the squeeze effect, the drive control unit 240 reads the first amplitude data and the second amplitude data representing the amplitude values for providing the tactile sensation from the memory 260 and outputs the data to the amplitude modulator 320.

Furthermore, when the user's fingertip touches the surface 120A of the top panel 120 and is stopped, the control device 300 vibrates the top panel 120 to detect pressing operation. When the user's fingertip is stopped, the moving speed is less than the predetermined threshold speed. When the moving speed is less than the predetermined threshold speed, the amplitude values represented by the first amplitude data and the second amplitude data output from the drive control unit 240 are set to predetermined amplitude values for detecting the pressing operation.

The predetermined amplitude values for detecting the pressing operation are different from the amplitude values for providing the tactile sensation, and are smaller than the amplitude values for providing tactile sensation. When the predetermined amplitude values for detecting the pressing operation are switched to the amplitude values for providing the tactile sensation, a tactile sensation can be provided that there is a recess, and in the opposite case, a tactile sensation can be provided that there is a protrusion.

Note that, in a case where the user's fingertip does not touch the top panel 120, in other words, in a case where no operational input is being performed, the amplitude values represented by the first amplitude data and the second amplitude data are set to zero, and the vibrating elements 140A and 140B are not driven.

The pressing operation determination unit 250 is connected to the detection circuit 190, and determines whether or not the pressing operation has been performed on the basis of changes in the voltages across the respective capacitors 180A and 180B detected by the detection circuit 190. The pressing operation determination unit 250 is an example of a first pressing determination unit and a second pressing determination unit.

When determining that the pressing operation has been performed, the pressing operation determination unit 250 outputs a signal (pressing event) representing that the pressing operation has been performed, to the application processor 220. As a result, the application processor 220 executes a function assigned to a predetermined GUI operation unit displayed at a position where the pressing operation has been performed.

Note that, here, it is assumed that the pressing operation is detected in a state where the vibrating elements 140A and 140B are driven by the first drive signal and the second drive signal.

Furthermore, the predetermined GUI operation unit is a GUI operation unit that accepts pressing operation, like a GUI operation unit representing an image of a button, for example. The area where the predetermined GUI operation unit is an area where the GUI operation unit is displayed that accepts the pressing operation, like the GUI operation unit representing the image of the button. The pressing event is used when the application processor 220 executes various applications of the electronic device 100.

The memory 260 stores the data in which the data representing the type of the application, the area data representing the GUI operation unit or the like on which the operational input is performed, and the pattern data representing the vibration pattern are associated with each other.

Furthermore, the memory 260 stores data and programs necessary for the application processor 220 to execute an application, data and programs necessary for the communication processor 230 to perform communication processing, and the like.

The sine wave generator 310 generates a sine wave necessary for generating the first drive signal and the second drive signal for vibrating the top panel 120 at the natural frequency. For example, in a case where the top panel 120 is vibrated at the natural frequency f of 33.5 kHz, the frequency of the sine wave is 33.5 kHz. The sine wave generator 310 inputs a sine wave signal in the ultrasonic band to the amplitude modulator 320.

The sine wave signal generated by the sine wave generator 310 is an AC reference signal to be a basis of the first drive signal and the second drive signal for generating the natural vibration in the ultrasonic band, and has a constant frequency and a constant phase. The sine wave generator 310 inputs a sine wave signal in the ultrasonic band to the amplitude modulator 320.

Note that, here, although a mode will be described in which the sine wave generator 310 that generates a sine wave signal is used, the signal does not have to be the sine wave signal. For example, a signal may be used having a waveform in which the rising and falling waveforms of the clock are blunted. For this reason, a signal generator that generates an AC signal in the ultrasonic band may be used instead of the sine wave generator 310.

Using the first amplitude data and the second amplitude data input from the drive control unit 240, the amplitude modulator 320 modulates the amplitude of the sine wave signal input from the sine wave generator 310 to generate the respective first drive signal and second drive signal. The amplitude modulator 320 modulates only the amplitude of the sine wave signal in the ultrasonic band input from the sine wave generator 310 to generate the first drive signal and the second drive signal without modulating the frequency and the phase.

For this reason, the first drive signal and the second drive signal output from the amplitude modulator 320 are sine wave signals in the ultrasonic band obtained by modulating only the amplitude of the sine wave signal in the ultrasonic band input from the sine wave generator 310.

Next, data to be stored in the memory 260 will be described with reference to FIG. 7. FIG. 7 is a table illustrating the data to be stored in the memory 260.

The data illustrated in FIG. 7 is data in which the data representing the type of the application, the area data representing a coordinate value of an area where the GUI operation unit or the like is displayed on which the operational input is performed, and the pattern data representing the vibration pattern are associated with each other.

The vibration pattern is a vibration pattern used for vibrating the vibrating elements 140A and 140B when the user touches the top panel 120 with the fingertip, and is used for generating the first drive signal and the second drive signal. The vibration pattern is pattern data in which the amplitude data used for generating the first drive signal and the second drive signal are arrayed in a time series. The amplitude data is arrayed at 10 kHz in the time axis direction, for example. The amplitude data is used as the first amplitude data and the second amplitude data. For this reason, the first amplitude data and the second amplitude data are equal to each other.

In FIG. 7, as the data representing the type of the application, an application identification (ID) is indicated. Furthermore, as the area data, formulas f1 to f5 are indicated each representing a coordinate value of the area where the GUI operation unit or the like is displayed on which operational input is performed. Furthermore, as the pattern data representing the vibration pattern, P1 to P5 are indicated.

The vibration pattern represented by each of the pattern data P1 to P4 is a vibration pattern used for providing a tactile sensation by reducing the dynamic friction coefficient applied to the fingertip tracing the surface 120A of the top panel 120 by using the squeeze effect, and changing intensity of the vibration, in a case where the position of the operational input is moving. The pattern data P1 to P4 are respectively associated with the formulas f1 to f4 each representing the coordinate value of the area where the GUI operation unit or the like is displayed.

Furthermore, the vibration pattern represented by the pattern data P5 is a vibration pattern used for vibrating the vibrating elements 140A and 140B with a predetermined constant amplitude value for detecting pressing operation in a case where the position of the operational input is stopped without moving. The formula f5 associated with the pattern data P1 represents the entire display area of the display panel 160. In other words, no matter where the position of the operational input is in the display area of the display panel 160, in a case where the position of the operational input is stopped, the vibrating elements 140A and 140B are vibrated with the predetermined constant amplitude value for detecting the pressing operation.

Note that, the application represented by the application ID included in the data stored in the memory 260 includes all applications that can be used on a smartphone terminal or a tablet computer, and also includes an email editing mode.

Figure 8:
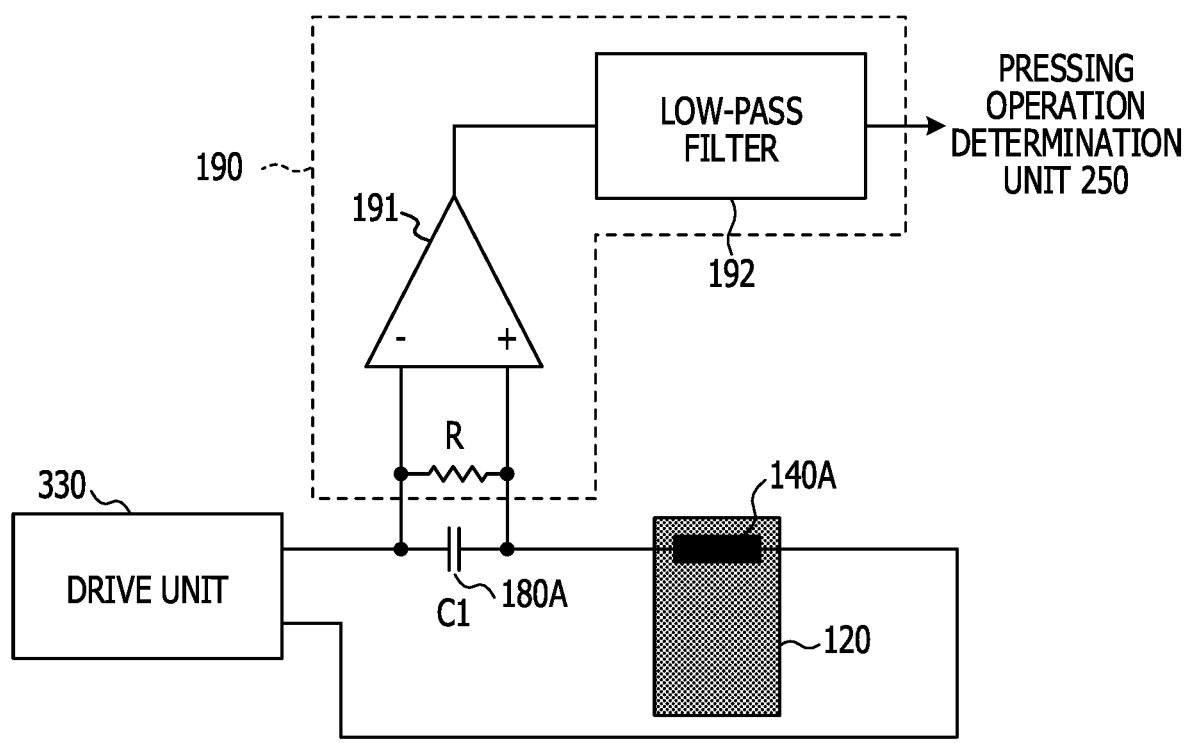
FIG. 8 is a diagram illustrating a portion related to determination of pressing operation, in the electronic device.

FIG. 8 is a diagram illustrating a portion related to determination of pressing operation, in the electronic device 100. FIG. 8 illustrates the top panel 120, the vibrating element 140A, the capacitor 180A, the detection circuit 190, and a drive unit 330, in the electronic device 100.

The drive unit 330 illustrates the amplifiers 141A and 141B, the drive control unit 240, the pressing operation determination unit 250, the memory 260, the sine wave generator 310, and the amplitude modulator 320 illustrated in FIG. 6 as one processing unit.

The detection circuit 190 includes a differential amplifier 191 and a low-pass filter 192. FIG. 8 illustrates the differential amplifier 191 and the low-pass filter 192 connected to the capacitor 180A among the components included in the detection circuit 190, but the detection circuit 190 actually includes a differential amplifier and a low-pass filter connected to the capacitor 180B.

The capacitor 180A and the capacitor 180B have the same configuration, and the differential amplifier and the low-pass filter connected to the capacitor 180B respectively have the same configurations as the differential amplifier 191 and the low-pass filter 192. For this reason, here, a description will be given of the differential amplifier 191 and the low-pass filter 192 connected to the capacitor 180A.

In the detection circuit 190, the differential amplifier 191 that detects the voltage across the capacitor 180A is an example of a first voltage detection unit, and in the detection circuit 190, the differential amplifier that detects the voltage across the capacitor 180B is an example of a second voltage detection unit.

The non-inverting input terminal (+) and the inverting input terminal (−) of the differential amplifier 191 are respectively connected to both ends of the capacitor 180A. FIG. 8 illustrates an input impedance R when the differential amplifier 191 is viewed from the capacitor 180A between the non-inverting input terminal (+) and the inverting input terminal (−) of the differential amplifier 191. The output terminal of the differential amplifier 191 is connected to the input terminal of the low-pass filter 192. The differential amplifier 191 amplifies and outputs the voltage across the capacitor 180A to the low-pass filter 192.

The input terminal of the low-pass filter 192 is connected to the output terminal of the differential amplifier 191, and the output terminal is connected to the pressing operation determination unit 250 illustrated in FIG. 6. The low-pass filter 192 transmits a band lower than or equal to a predetermined cutoff frequency in a voltage signal input from the differential amplifier 191 and outputs the band to the pressing operation determination unit 250. The cutoff frequency is only required to be set to a frequency that can remove a component in the ultrasonic band from an output of the differential amplifier 191.

The low-pass filter 192 can be implemented by an rc circuit including a resistor r and a capacitor c, or a circuit that takes in an input signal subjected to analog to digital (A/D) conversion and then removes components above the cutoff frequency by numerical calculation.

Figure 9:
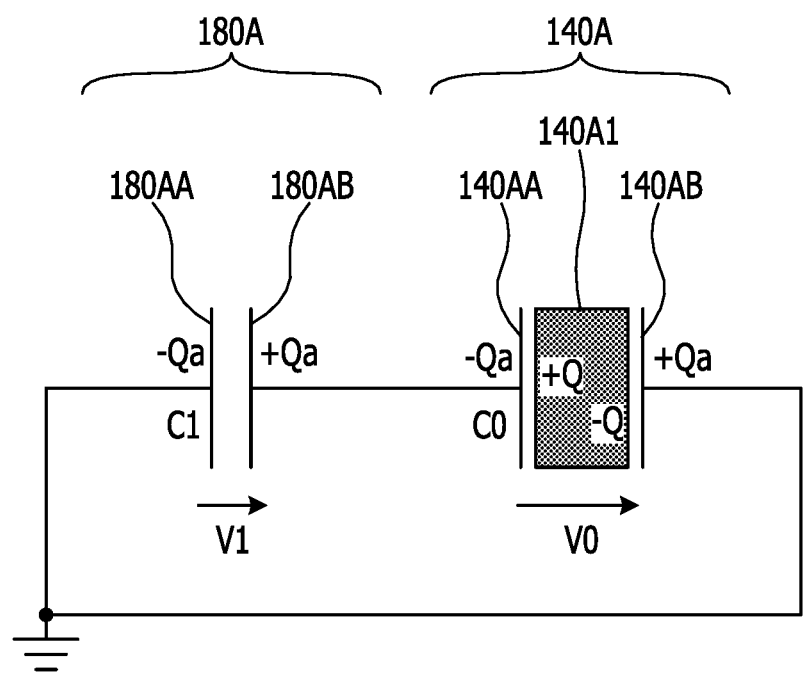
FIG. 9 is a diagram illustrating a principle of detecting the pressing operation.

FIG. 9 is a diagram illustrating a principle of detecting the pressing operation. FIG. 9 illustrates a closed circuit including the vibrating element 140A and the capacitor 180A.

The vibrating element 140A includes a piezoelectric body 140A1 and electrodes 140AA and 140AB. The capacitor 180A includes electrodes 180AA and 180AB. The electrode 140AA and the electrode 180AB are connected to each other, and the electrode 140AB and the electrode 180AA are grounded.

When the surface 120A of the top panel 120 (see FIG. 8) is pressed, the vibrating element 140A attached to the surface on the opposite side of the top panel 120 from the surface 120A is pressed and deformed.

When the piezoelectric body 140A1 is deformed, polarization occurs, whereby surface charges +Q and −Q appear on both surfaces of the piezoelectric body 140A1. Here, the surface of the piezoelectric body 140A1 and the electrodes 140AA and 140AB formed on the surface of the piezoelectric body 140A1 are considered separately.

If there is not the capacitor 180A in the circuit of FIG. 9, a current flows through the closed circuit, and charges −Q and +Q opposite to the surface charges of the piezoelectric body 140A1 are accumulated in the electrodes 140AA and 140AB, respectively, to cancel the surface charges +Q and −Q due to the polarization out.

However, when the vibrating element 140A is viewed from the outside, the surface charges +Q and −Q of the piezoelectric body 140A1 and the charges −Q and +Q of the electrodes 140AA and 140AB are canceled out, and no voltage is generated between the piezoelectric body 140A1 and the electrodes 140AA and 140AB, so that the deformation of the vibrating element 140A cannot be detected.

Thus, as illustrated in FIG. 8, if the capacitor 180A is connected in series between the vibrating element 140A and the drive unit 330, and the first drive signal is applied to the vibrating element 140A from the drive unit 330 via the capacitor 180A, a state of the charges as illustrated in FIG. 9 can be detected by the differential amplifier 191 in a case where the vibrating element 140A is deformed.

When the surface charges of the piezoelectric body 140A1 due to the deformation of the vibrating element 140A are +Q and −Q, and a charge accumulated in the electrode 140AA of the piezoelectric body 140A1 is −Qa, since the electrode 140AA is connected to the electrode 180AB of the capacitor 180A, a charge of the electrode 180AB becomes +Qa. Then, an opposite charge −Qa is accumulated in the electrode 180AA of the capacitor 180A. The electrode 140AB of the piezoelectric body 140A1 accumulates a charge +Qa opposite to that of the electrode 140AA.

When a voltage across the vibrating element 140A is V0, and a voltage across the capacitor 180A is V1, since the closed circuit including the vibrating element 140A and the capacitor 180A is grounded, the following formula (3) is established.

$$V0+V1=0 \tag{3}$$

Furthermore, when a capacitance C1 of the capacitor 180A is assumed, the following formula (4) is established for the capacitor 180A.

$$Qa=C1\times V1 \tag{4}$$

Regarding the vibrating element 140A, a relationship of Q=C×V is established including not only the charges of the electrodes 140AA and 140AB but also the surface charges +Q and −Q of the piezoelectric body 140A1 generated by the deformation. For this reason, when a capacitance C0 of the vibrating element 140A is assumed, the following formula (5) is established.

$$-Q+Qa=C0\times V0 \tag{5}$$

Substituting the formulas (4) and (5) into the formula (3) gives the following.

$$(-Q+Qa)/C0+Qa/C1=0$$

Further transformation results in the following, and the formula (6) is obtained.

$$Qa(1/C0+1/C1)=Q/C0$$

$$Qa(C1+C0)/(C0\times C1)=Q/C0$$

$$Qa=Q\times C1/(C0+C1) \tag{6}$$

When the formula (6) is rewritten by using the formula (4), the following formula (7) is obtained.

$$V1=Q/(C0+C1) \tag{7}$$

From the formula (7), it can be seen that the voltage V1 across the capacitor 180A is generated in proportion to an absolute value of the surface charges +Q and −Q generated in the piezoelectric body 140A1 due to the deformation. Furthermore, the voltage V0 across the vibrating element 140A is generated with the opposite sign of the voltage V1.

From the above, by isolating the vibrating element 140A and the drive unit 330 in a DC manner by the capacitor 180A, a voltage signal due to the deformation of the vibrating element 140A can be detected by the capacitor 180A or the vibrating element 140A.

The first drive signal (high-frequency voltage signal) output from the drive unit 330 is divided into the vibrating element 140A and the capacitor 180A in the configuration of FIG. 8. Generally, since the impedance of a capacitor of a capacitance C is $1/\omega C$ ($\omega$ is an angular frequency), if the vibrating element 140A is also approximately a capacitor, the voltage ratio between the vibrating element 140A and the capacitor 180A is considered to be $1/C0:1/C1=C1:C0$.

Thus, to allow the high-frequency voltage signal of the drive unit 330 to be mainly applied to the vibrating element 140A and to vibrate the top panel 120 efficiently, the capacitance C1 of the capacitor 180A is desirably made larger than the capacitance C0 of the vibrating element 140A.

By the way, from the formula (7), since the voltage generated by the deformation of the vibrating element 140A becomes smaller as the capacitance C1 becomes larger, the value of the capacitance C1 needs to be determined in a balanced manner. For example, if the capacitance C1 is about 10 times the capacitance C0, it is considered that the voltage generated by the deformation of the vibrating element 140A can be sufficiently detected while importance of the vibration efficiency of the top panel 120 is considered.

Furthermore, in the circuit system including the vibrating element 140A, the capacitor 180A, the detection circuit 190, and the drive unit 330 as illustrated in FIG. 8, a time during which the voltage is held in the capacitor 180A is determined by values of the input impedance (input resistance) R of the detection circuit 190 and the capacitance C1+C0, and a time constant can be considered as $R \times (C1+C0)$. Since operation of pressing the top panel 120 (pressing operation) is performed in a time of about 1 second, it is sufficient that the input impedance R is designed so that the time constant is longer than or equal to the time required for performing the pressing operation. For example, if the capacitance C1+C0 is 1 μF, if the input impedance R is set to 10 MΩ, the time constant is about 10 seconds, which is a design suitable for detecting the pressing operation.

Figure 10:
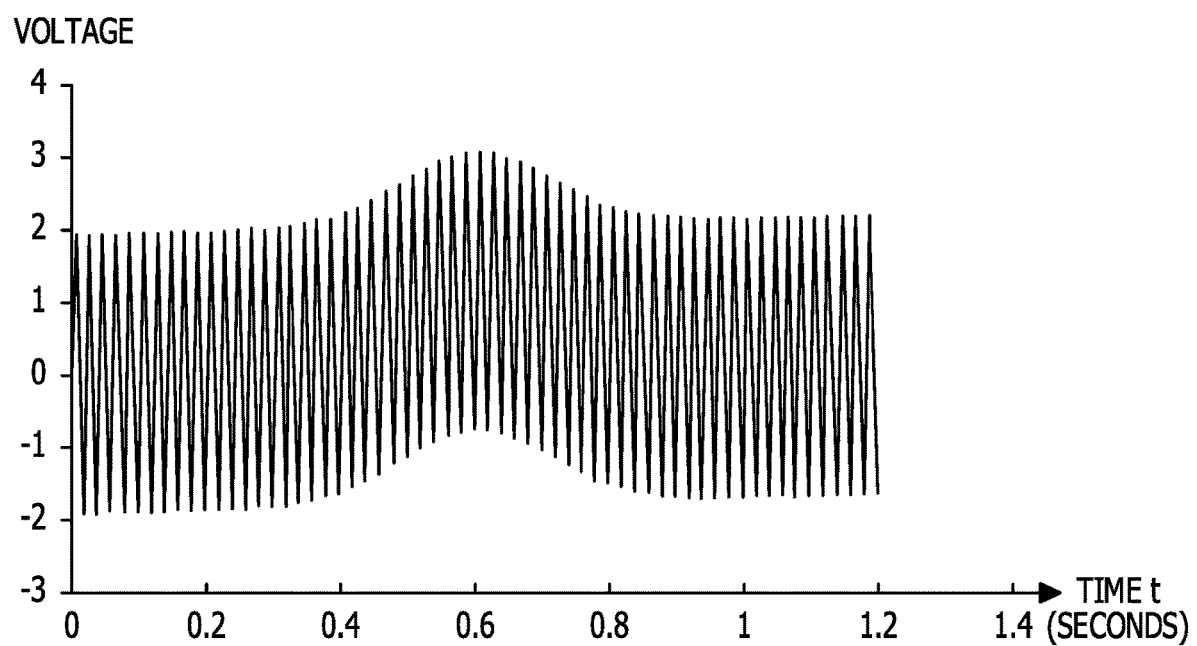
FIG. 10 is a diagram illustrating the voltage across a capacitor.
Figure 11:
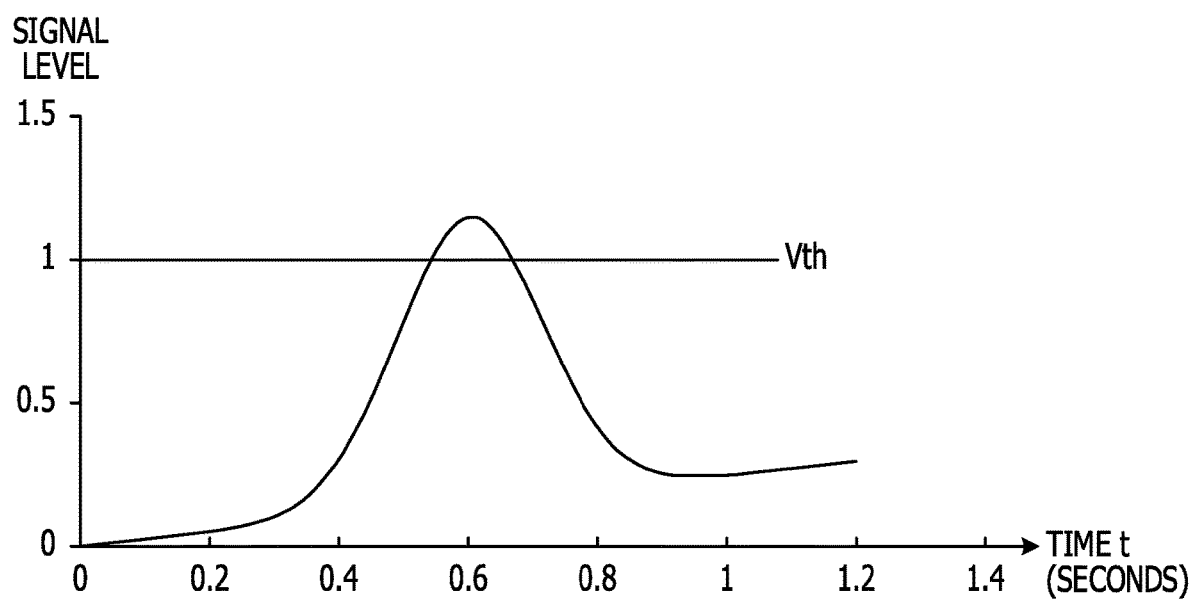
FIG. 11 is a diagram illustrating an output of a low-pass filter.

FIG. 10 is a diagram illustrating a change over time in the voltage across the capacitor 180A. The horizontal axis represents time t (seconds), and the vertical axis represents the voltage across the capacitor (no unit). FIG. 11 is a diagram illustrating an output of the low-pass filter 192. The horizontal axis represents time t (seconds), and the vertical axis represents the signal level (no unit) of a pressing signal. The signal level is a voltage value.

The voltage across the capacitor 180A schematically has a signal waveform in which a high-frequency voltage (first drive signal) and a voltage signal generated by pressing are superimposed on each other as illustrated in FIG. 10. In FIG. 10, to make the signal waveform easy to understand, the high-frequency frequency is illustrated to be considerably lower than the actual frequency. Note that, hereinafter, a voltage signal generated by pressing is referred to as a pressing signal.

When the high-frequency component is removed by the low-pass filter 192, a signal waveform illustrated in FIG. 11 is obtained. The signal waveform illustrated in FIG. 11 is a pressing signal and indicates that the top panel 120 is pressed around 0.6 seconds on the horizontal axis. The pressing signal is a voltage signal that has a very low frequency and a slow amplitude change compared to a high-frequency voltage (the first drive signal in the ultrasonic band), and is therefore extracted easily by the low-pass filter 192.

To detect pressing operation from such a pressing signal, it is sufficient that a predetermined determination threshold value Vth is provided and it is determined that the pressing operation has been performed in a case where the pressing signal becomes greater than or equal to the predetermined determination threshold value Vth. Such determination processing is only required to be performed by the pressing operation determination unit 250.

By the way, even if the user presses the top panel 120 with a constant force, the amount of deformation of the vibrating element 140A differs depending on a pressing position, and the voltage value of the voltage between the electrodes 180AA and 180AB of the capacitor 180A may differ. This is because the vibrating element 140A is an elongated member in a plan view provided along the X-axis at the end of the top panel 120 on the Y-axis negative direction side, and most of the top panel 120 is an area where the vibrating element 140A is not provided, and the distance to the vibrating element 140A differs.

As described above, in a case where the pressing operation is to be detected with high accuracy, even in case where the pressing operation has been performed with a weak force at a position (for example, a central portion in the Y-axis direction of the top panel 120) away from the vibrating element 140A, in a case where the voltage value of the voltage across the capacitor 180A differs depending on a position where the pressing operation is performed, it is sufficient that the determination threshold value Vth is made different depending on a planar position of the top panel 120.

Furthermore, if a plurality of determination threshold values Vth having different levels is provided at each position of the top panel 120, the user can select the input content depending on a level of pressing force, which is very useful.

FIG. 12 is a diagram illustrating a database of the determination threshold values Vth. In the database of the determination threshold values Vth, the determination threshold values Vth are assigned to a total of 40 points, 5 points at equal intervals in the X-axis direction and 8 points at equal intervals in the Y-axis direction in the XY coordinate of the touch panel 150. Positions of 40 points to which the determination threshold values Vth of 40 points are assigned, are determined with XY coordinates.

In FIG. 12, the determination threshold value Vth(X, Y) assigned to each of 40 points is indicated from Vth(1,1) to Vth(5,8). In the X-axis direction, the determination threshold value Vth(X, Y) is set to a low value on the X-axis negative direction side and the X-axis positive direction side, and to a high value on the central portion of the X-axis, and in the Y-axis direction, the determination threshold value Vth(X, Y) is set to a high value on the Y-axis negative direction side and the Y-axis positive direction side, and to a low value on the Y-axis central portion.

This is because, in the X-axis direction, the X-axis negative direction side and the X-axis positive direction side are positions away from the vibrating elements 140A and 140B, and in the Y-axis direction, the central portion is a position away from the vibrating elements 140A and 140B.

It is sufficient that a database of such determination threshold values Vth is stored in the memory 260, values are read of multiple determination threshold values Vth around a position where the pressing operation has been performed, and interpolation processing is performed based on a relationship between the position where the pressing operation has been performed and positions assigned to the multiple determination threshold values Vth, whereby the determination threshold value Vth at the position where the pressing operation has been performed is calculated. Such processing is only required to be performed by the pressing operation determination unit 250.

Next, with reference to FIG. 13, processing will be described executed by the drive control unit 240 of the control device 300 of the electronic device 100 according to the embodiment.

Figure 13:
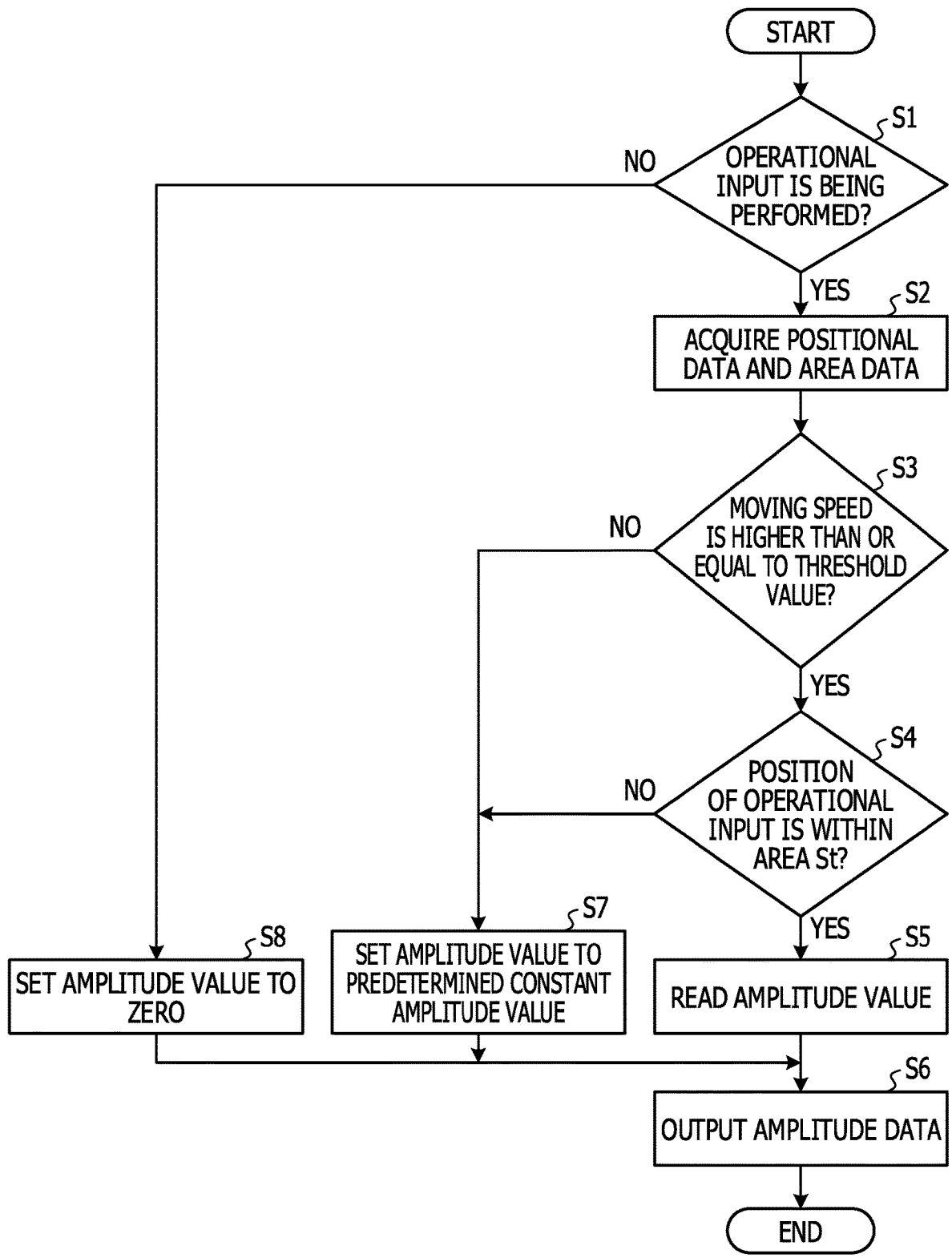
FIG. 13 is a flowchart illustrating processing executed by a drive control unit of a control device of the electronic device according to the embodiment.

FIG. 13 is a flowchart illustrating the processing executed by the drive control unit 240 of the control device 300 of the electronic device 100 according to the embodiment.

The operating system (OS) of the electronic device 100 executes control for driving the electronic device 100 for each predetermined control cycle. For this reason, the control device 300 performs computing for each predetermined control cycle. The same applies to the drive control unit 240, and the drive control unit 240 repeatedly executes the flow illustrated in FIG. 13 for each predetermined control cycle.

The drive control unit 240 starts the processing when the power of the electronic device 100 is turned on.

The drive control unit 240 determines whether or not operational input is being performed (step S1). The processing of step S1 is processing of determining whether or not the operational input is being performed by determining whether or not the touch panel 150 is outputting positional data. Note that, in a case where the touch panel 150 outputs positional data representing that the position is indefinite in a case where no operational input is being performed, it is sufficient to determine whether or not the operational input is being performed depending on whether or not the positional data represents XY coordinates.

When determining that the operational input is being performed (S1: YES), the drive control unit 240 acquires area data associated with a vibration pattern for the GUI operation unit on which the operational input is currently being performed depending on coordinates represented by current positional data, and the type of a current application (step S2).

The drive control unit 240 determines whether or not the moving speed is higher than or equal to the predetermined threshold speed (step S3). It is sufficient that the moving speed is calculated by vector operation. Note that, it is sufficient that the threshold speed is set as the minimum speed of the moving speed of the fingertip at the time when the operational input is performed while the fingertip is moved such as so-called flick operation, swipe operation, and drag operation. Such a minimum speed may be set on the basis of an experimental result, or may be set depending on resolution of the touch panel 150, or the like.

In a case where it is determined in step S3 that the moving speed is higher than or equal to the predetermined threshold speed, the drive control unit 240 determines whether or not the position of the operational input represented by the positional data obtained in step S2 is within an area St represented by the area data (step S4).

In a case where it is determined that the position of the operational input is within the area St, the drive control unit 240 reads, from the pattern data, the amplitude data representing the amplitude value corresponding to the moving speed obtained in step S3 (step S5).

The drive control unit 240 outputs the amplitude data (step S6). Therefore, the amplitude of the sine wave output from the sine wave generator 310 is modulated in the amplitude modulator 320, whereby a modulation signal is generated, and on the basis of the modulation signal, a drive signal is generated, and the vibrating elements 140A and 140B are driven.

On the other hand, in a case where it is determined in step S1 that no operational input is being performed (S1: NO), the drive control unit 240 sets the amplitude data to zero (step S8). Since no operation is being performed, the amplitude is set to zero, and the vibrating elements 140A and 140B are not driven.

In a case where it is determined that operational input is being performed (S1: YES), in a case where it is determined in step S3 that the moving speed is not higher than or equal to the predetermined threshold speed (S3: NO), and in a case where it is determined in step S4 that the position of the operational input is not within the area St, the drive control unit 240 performs setting to the predetermined constant amplitude value for detecting the pressing operation (step S7). This is to prepare for detection of the pressing operation.

As a result, the drive control unit 240 outputs amplitude data representing the predetermined constant amplitude value for detecting the pressing operation, and in the amplitude modulator 320, the modulation signal is generated in which the amplitude of the sine wave output from the sine wave generator 310 is modulated. In this case, the vibrating elements 140A and 140B are driven with the predetermined constant amplitude value for detecting the pressing operation.

Figure 14:
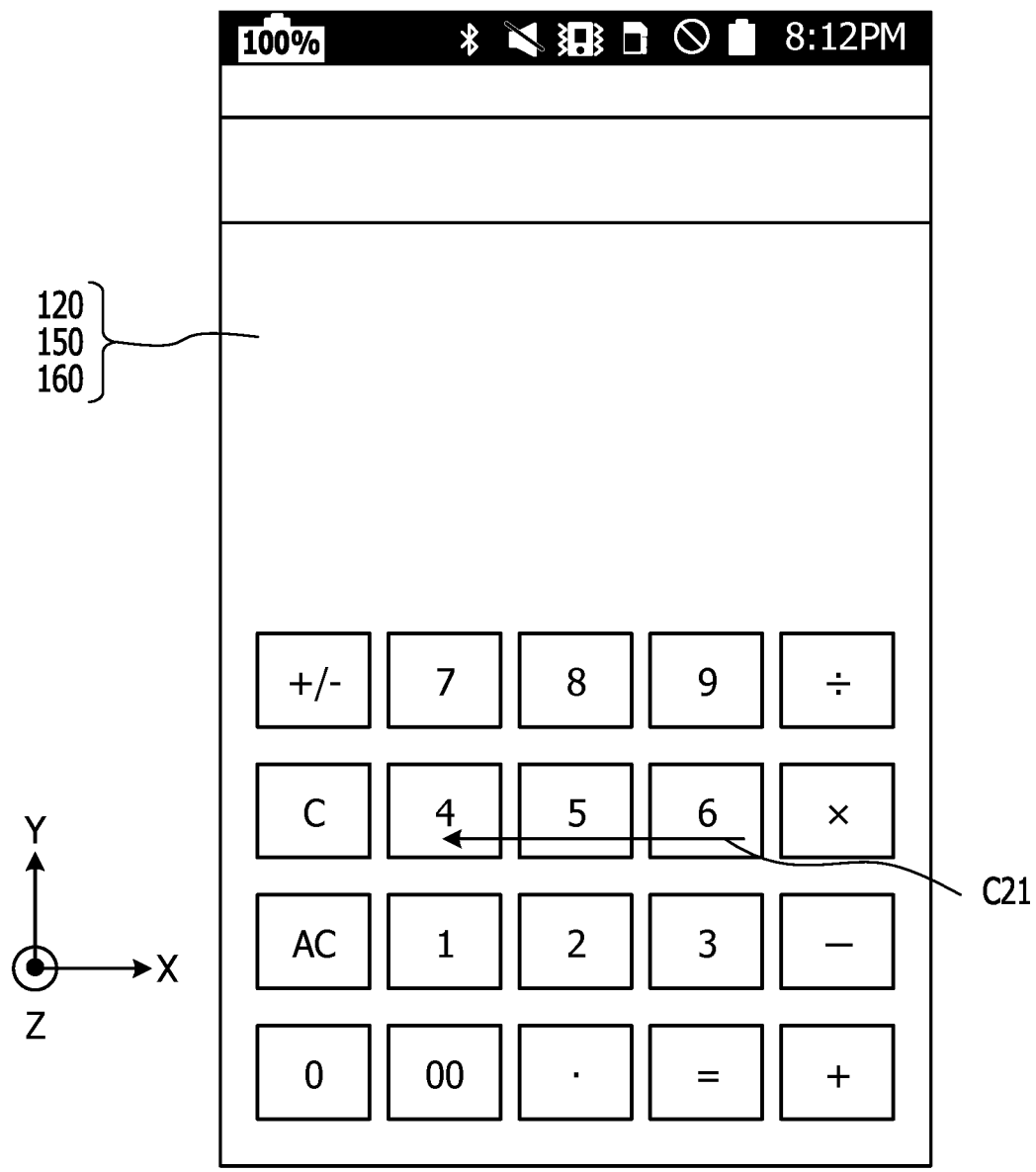
FIG. 14 is a diagram illustrating an operation example of the electronic device according to the embodiment.
Figure 15:
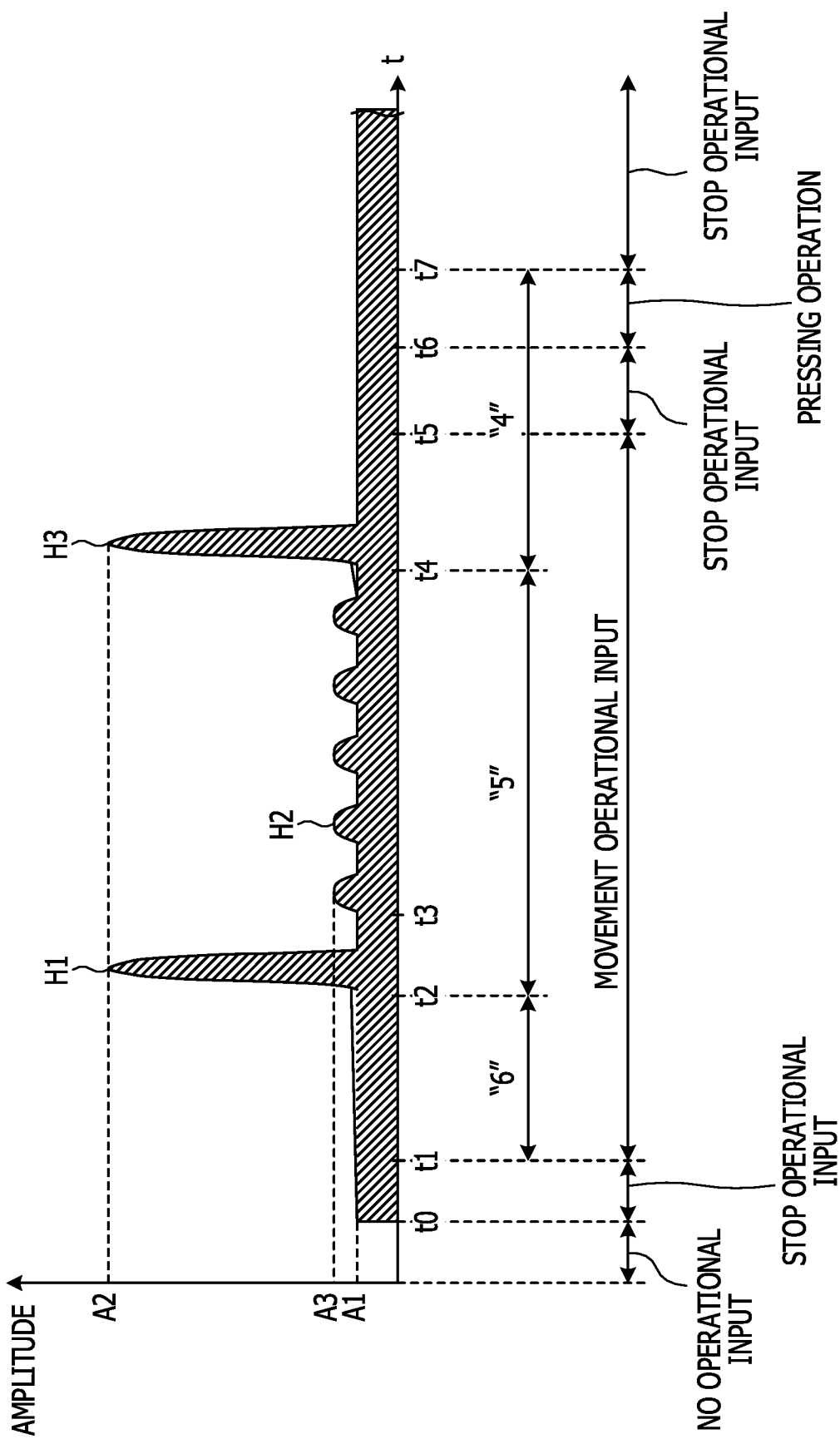
FIG. 15 is a diagram illustrating the operation example of the electronic device according to the embodiment.

Next, with reference to FIGS. 14 and 15, operation will be described of the drive control unit 240 in a case where operational input is performed in an operation mode in which a calculator application is executed in the electronic device 100 of the embodiment. FIGS. 14 and 15 are diagrams illustrating an operation example of the electronic device 100 according to the embodiment.

As illustrated in FIG. 14, in the operation mode in which the calculator application is executed, in a case where movement operational input has been performed of tracing in the order of the numerals '6', '5', and '4' by moving the user's fingertip to the left from a state where the fingertip touches the numeral '6', the vibration of the top panel 120 is performed as follows. Such movement operational input is operational input performed while the fingertip moves across multiple GUI operation units in a state where the multiple GUI operation units are displayed side by side.

Until time t0 when the user touches the top panel 120 with the fingertip, the amplitude of the drive signal is set to zero.

At the time t0 when the user's fingertip starts touching the top panel 120, the drive control unit 240 drives the vibrating elements 140A and 140B by a drive signal set to a constant amplitude A1 for detecting pressing operation. The amplitude A1 is amplitude data. Note that, at this point, the user's fingertip is touching the top panel 120 in a stopped state without moving. In other words, operational input (stop operational input) is performed in a state where the fingertip is stopped, and no movement operational input or pressing operation is performed.

Then, it is assumed that the user starts moving the fingertip touching a position C21 (see FIG. 14) on the numeral '6' at time t1. Then, at time t2 when the user slightly moves the fingertip from the position C21, and the position of the fingertip moves out of the area of the numeral '6' and enters the numeral '5', a vibration H1 is generated with a large amplitude A2 in a short time. The vibration H1 has a vibration pattern in which a vibration with a large amplitude in a short time is added to a vibration with the amplitude A1.

The vibration H1 is generated when the position of the fingertip moves out of the area of the numeral '6', and provides the user with a tactile sensation that the fingertip touches a protrusion by bringing the user's fingertip from a low friction state in an unperceived short time into a high friction state instantaneously.

Furthermore, when the fingertip moves further to the left within the numeral '5', a small vibration H2 is generated with an amplitude A3 in a short time from the time t3 at a constant time interval. The vibration H2 has a vibration pattern in which a vibration with a small amplitude generate at a constant interval in a short time is added to the vibration with the amplitude A1.

This is a vibration generated for the user to be able to sense of touching the numeral '5' only with the sense of the fingertips without looking at the top panel 120, because the numeral '5' is located at the center of the numeric keypad. For example, the amplitude A3 is about twice the amplitude A1.

Then, at time t4, when the fingertip moves out of the area of the numeral '5' and enters the area of '4', a vibration H3 is generated with the large amplitude A2 in a short time. The vibration H3 is the same vibration as the vibration H1, and provides the user with a tactile sensation that the fingertip touches a protrusion by bringing the user's fingertip from a low friction state in an unperceived short time into a high friction state instantaneously, thereby causing the user to sense that the fingertip has entered the area of the numeral '4' from the area of '5' with a tactile sensation.

Therefore, the user can sense that the numerals '6', '5', and '4' are traced in order.

Furthermore, when the user stops the fingertip at time t5, the drive control unit 240 drives the vibrating elements 140A and 140B by a drive signal set to the constant amplitude A1 for detecting the pressing operation.

Then, at time t6, the user starts the pressing operation, and at time t7, the pressing operation is detected by the pressing operation determination unit 250 and the pressing operation ends. In this state, since the user's fingertip is not moving along the top panel 120, the drive control unit 240 drives the vibrating elements 140A and 140B while holding the amplitude value at A1.

After the time t7, the user's fingertip touches the top panel 120 and the operational input is being performed, but the user's fingertip is stopped, so that the drive control unit 240 continues driving the vibrating elements 140A and 140B by the drive signal set to the amplitude A1, for making a state of detecting the pressing operation.

Figure 16:
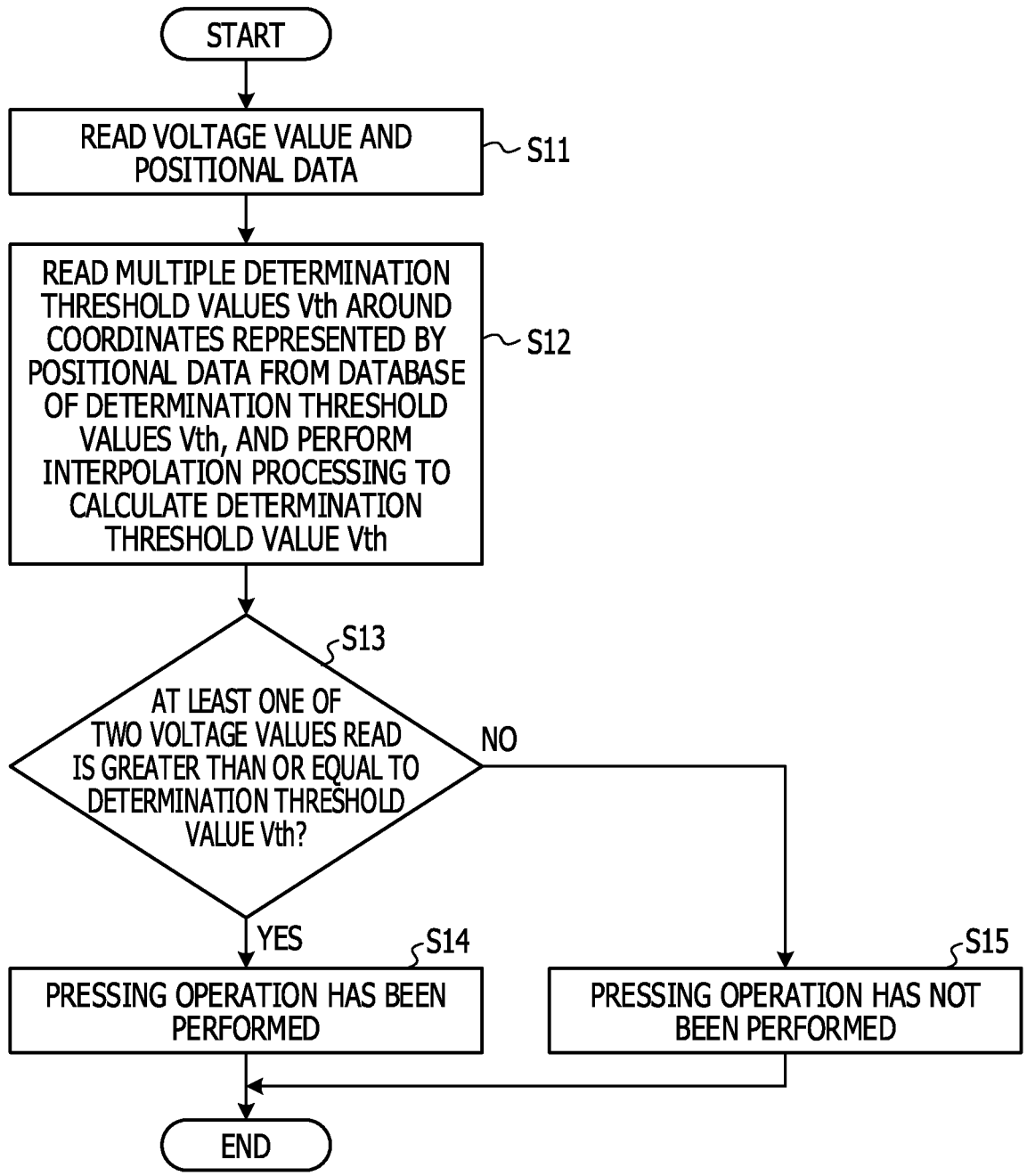
FIG. 16 is a flowchart illustrating determination processing of the pressing operation performed by a pressing operation determination unit.

FIG. 16 is a flowchart illustrating the determination processing of the pressing operation performed by the pressing operation determination unit 250.

The pressing operation determination unit 250 starts processing when the power of the electronic device 100 is turned on (start).

The pressing operation determination unit 250 reads the voltage value input from the two low-pass filters 192 connected to the capacitors 180A and 180B, and the positional data input from the touch panel 150 (step S11).

The pressing operation determination unit 250 reads multiple determination threshold values Vth around the coordinates represented by the positional data read in step S11 from the database of the determination threshold values Vth stored in the memory 260, and performs interpolation processing, thereby calculating a determination threshold value Vth at the coordinates represented by the positional data (step S12).

The pressing operation determination unit 250 determines whether or not at least one of the two voltage values read in step S11 is greater than or equal to the determination threshold value Vth obtained in step S12 (step S13).

In a case where at least one of the two voltage values read is greater than or equal to the determination threshold value Vth (S13: YES), the pressing operation determination unit 250 determines that pressing operation has been performed (step S14).

On the other hand, in a case where both of the two voltage values read are not greater than or equal to the determination threshold value Vth (S13: NO), the pressing operation determination unit 250 determines that the pressing operation has not been performed (step S15).

When the processing of step S14 or S15 is completed, the pressing operation determination unit 250 ends the series of processing steps (end). The pressing operation determination unit 250 repeatedly executes the processing from the start to the end every predetermined system cycle while the power of the electronic device 100 is turned on.

As described above, the control device 300 monitors the voltages across the capacitors 180A and 180B inserted in series between the amplifiers 141A and 141B and the vibrating elements 140A and 140B.

By using the capacitors 180A and 180B and calculating the surface charges of the piezoelectric body 140A1 (see FIG. 9) in accordance with the above formulas (3) to (7) in consideration of +Q and −Q, the voltage V1 across each of the capacitors 180A and 180B can be obtained.

Furthermore, the voltage V1 between both ends is amplified by the differential amplifier 191 and then the high-frequency component (first drive signal and second drive signal) is removed by the low-pass filter 192, a pressing signal of the user is obtained as illustrated in FIG. 11.

Then, the pressing operation determination unit 250 calculates the determination threshold value Vth at the position where the pressing operation has been performed, and determines whether or not the voltage generated by the pressing operation is greater than or equal to the determination threshold value Vth obtained, whereby it can be determined whether or not the pressing operation has been performed.

While no operational input is being performed, the drive control unit 240 drives the vibrating elements 140A and 140B by using the first drive signal and the second drive signal with the constant amplitude A1 for detecting the pressing operation. For this reason, in a case where the user, from a state where the fingertip is not touching the top panel 120, touches the top panel 120, and performs pressing operation without moving the fingertip, the first drive signal and the second drive signal are removed by the low-pass filters 192, whereby it is possible to obtain a pressing signal in a case where the user performs the pressing operation without moving the fingertip. Then, by comparing the pressing signal with the determination threshold value, it is possible to detect that the pressing is being performed.

Furthermore, also in a case where the operational input is being performed but the moving speed is less than the threshold speed, and in a case where the operational input is being performed and the moving speed is higher than or equal to the threshold speed, but the position of the operational input is not within the predetermined area St, the drive control unit 240 drives the vibrating elements 140A and 140B by using the first drive signal and the second drive signal with the constant amplitude A1 for detecting the pressing operation. For this reason, the pressing operation can be detected similarly.

Furthermore, in a case where the operational input is being performed and the moving speed is higher than or equal to the threshold speed, and the position of the operational input is within the predetermined area St, the drive control unit 240 drives the vibrating elements 140A and 140B by using the first drive signal and the second drive signal in which the amplitude for tactile sensation is further added to the constant amplitude A1 for detecting the pressing operation.

For this reason, by removing the first drive signal and the second drive signal by the low-pass filter 192, it is possible to obtain a pressing signal in a case where the user performs pressing operation while moving the fingertip within the predetermined area St. Then, by comparing the pressing signal with the determination threshold value, it is possible to detect that the pressing is being performed. The change in amplitude for representing the tactile sensation included in the first drive signal and the second drive signal is removed as the first drive signal and the second drive signal by the low-pass filter 192, so that a voltage signal as illustrated in FIG. 11 can be obtained even in a case where the pressing operation is performed while the fingertip is moved.

As described above, the control device 300 can detect both the pressing operation performed with the fingertip stopped, and the pressing operation performed with the fingertip moved.

Here, the components used for such pressing determination are the capacitors 180A and 180B, the detection circuit 190, and the pressing operation determination unit 250.

The capacitors 180A and 180B are only required to be small capacitor chips, for example, and to be inserted in series in the wiring between the vibrating elements 140A and 140B and the amplifiers 141A and 141B, so that the capacitors 180A and 180B can be arranged in a small space such as a gap inside the electronic device 100.

Furthermore, as the configuration of the electric circuit, the differential amplifier 191 and the low-pass filter 192 of the detection circuit 190 are only required to be provided between the control unit 200 and the capacitors 180A and 180B, and spatially, they can be arranged in a small space such as a gap inside the electronic device 100.

Furthermore, the pressing operation determination unit 250 is included inside the control unit 200 implemented by the IC chip.

Thus, the control device 300 including the capacitors 180A and 180B, the detection circuit 190, and the pressing operation determination unit 250 can be implemented with a very simple configuration.

From the above, according to the embodiment, it is possible to provide the control device 300 and the electronic device 100 each having a simple configuration, and a method for controlling the electronic device 100.

Note that, in the above, a mode has been described in which the pressing operation is used as operation for confirming the input content. However, the pressing operation can be used for other purposes.

For example, it is conceivable to use the pressing signal for controlling the amplitude data output from the drive control unit 240 for ultrasonic vibration. Since the effect of reducing the dynamic friction coefficient by ultrasonic vibration tends to decrease when the pressing force is large, it can be considered that adjustment is performed to increase the amplitude in a case where the voltage level of the pressing signal is large.

Furthermore, in a case where the dynamic friction coefficient is almost constant regardless of the pressing force, the force required for the user to move the fingertip along the surface 120A while touching the top panel 120 is proportional to the product of the pressing force and the dynamic friction coefficient, so that the force necessary for moving the fingertip along the surface 120A increases in a case where the pressing force is large.

To make it easier to move the fingertip along the surface 120A by reducing the dynamic friction coefficient even when the pressing force is large, adjustment may be performed so that the amplitude data output from the drive control unit 240 is increased when the voltage level of the pressing signal is large.

To perform these controls, it is sufficient that the voltage level of the pressing signal, the amplitude data output from the drive control unit 240, and the correction magnification are determined in advance and stored in the memory 260 as data.

Furthermore, in the above, a mode has been described in which the drive control unit 240 outputs the drive signal in the ultrasonic band as the first drive signal and the second drive signal, and generates the natural vibration in the ultrasonic band in the top panel 120. However, the vibration generated in the top panel 120 does not have to be the natural vibration in the ultrasonic band, and may be the natural vibration in a frequency band lower than the ultrasonic band (for example, an audible range). In this case, it is sufficient that the sine wave generator 310 outputs a sine wave in the audible range. Furthermore, the vibration generated in the top panel 120 does not have to be a natural vibration.

Furthermore, in the above, a mode has been described in which the two amplifiers 141A and 141B are connected to the vibrating elements 140A and 140B; however, the two amplifiers 141A and 141B may be replaced with one amplifier, and the one amplifier may output the first drive signal and the second drive signal.

Furthermore, in the above, a mode has been described in which the pressing operation determination unit 250 is provided separately from the application processor 220 inside the control unit 200. However, the pressing operation determination unit 250 may be included in the application processor 220. In this case, the pressing operation determination unit 250 may be a function implemented by the OS of the application processor 220.

Furthermore, in the above, a mode has been described in which the amplitude of the first drive signal and the second drive signal is held at the constant amplitude A1 in a case other than a case where the user is performing the operational input, and the moving speed is higher than or equal to the threshold speed, and the position of the operational input is within the predetermined area St; however, the amplitude A1 may be set to zero. This is equivalent to a state in which the amplitude modulator 320 does not output drive signals. To set the amplitude A1 to zero is to set the first amplitude data and the second amplitude data to zero.

Even in such a case, in a case where the pressing operation is performed in a case where the user is performing the operational input, and the moving speed is higher than or equal to the threshold speed, and the position of the operational input is within the predetermined area St, detection is possible similarly.

Furthermore, in a case other than the above, in a state where the vibrating elements 140A and 140B are not driven, the voltage generated in the capacitors 180A and 180B due to pressing on the top panel 120 is amplified by the differential amplifier 191 and passes through the low-pass filter 192, and a pressing signal as illustrated in FIG. 11 is obtained. For this reason, the pressing operation determination unit 250 can detect the pressing operation as in the case where the amplitude A1 is not zero.

Furthermore, a drift component whose level rises as a whole at a frequency lower than that of the pressing signal is superimposed on the pressing signal illustrated in FIG. 11. This is observed in an experiment with an actual top panel 120, and is presumed to be caused by a temperature rise caused by driving the vibrating element 140A by the first drive signal. The drift component is represented by a curve in which a curve around from time 0 seconds to 0.2 seconds in FIG. 11 extends as it is and connects to that from time 1 second to 1.2 seconds.

Figure 17:
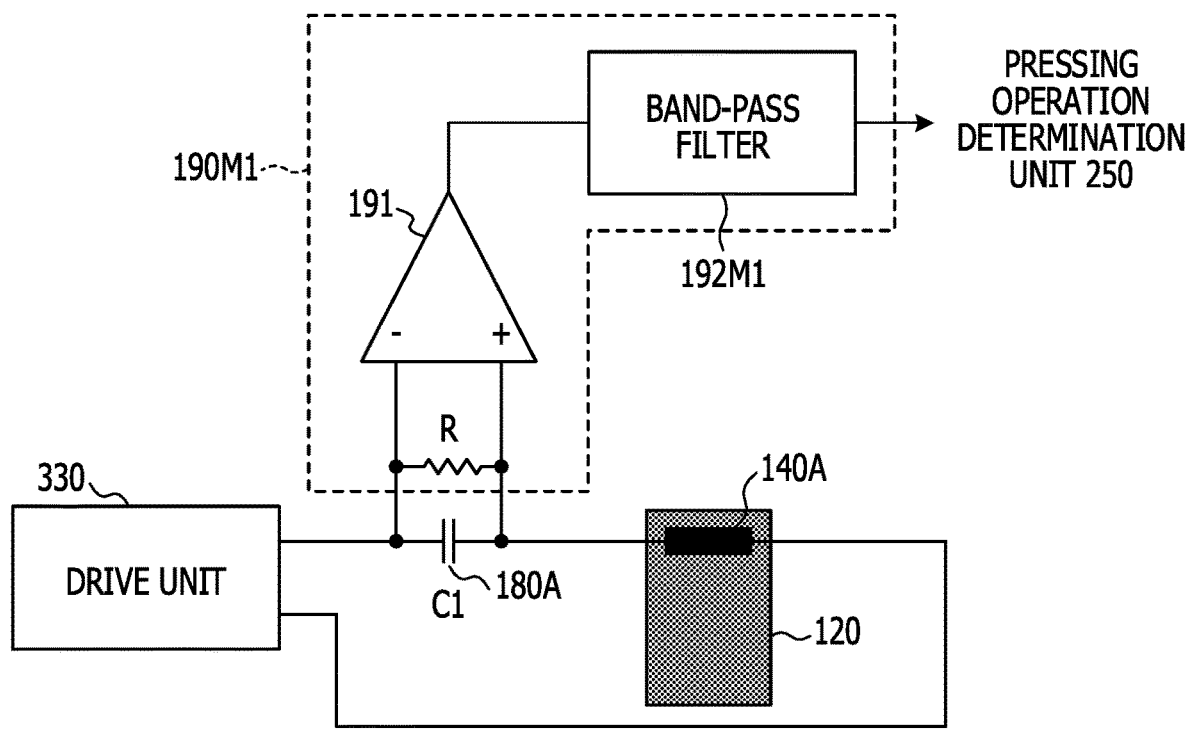
FIG. 17 is a diagram illustrating a first modification of the portion related to the determination of the pressing operation, in the electronic device.

In a case where there is a possibility that the determination accuracy of the pressing operation is lowered due to such a drift component, the following detection circuit 190M1 may be used instead of the detection circuit 190 illustrated in FIG. 8. FIG. 17 is a diagram illustrating a first modification of the portion related to the determination of the pressing operation, in the electronic device 100. In FIG. 17, the detection circuit 190M1 is provided instead of the detection circuit 190 illustrated in FIG. 8.

The detection circuit 190M1 includes the differential amplifier 191 and a band-pass filter 192M1. In other words, the detection circuit 190M1 has a configuration in which the low-pass filter 192 of the detection circuit 190 illustrated in FIG. 8 is replaced with the band-pass filter 192M1.

It is sufficient that the band-pass filter 192M1 is provided on the output side of the differential amplifier 191 to remove the high-frequency (first drive signal) component and the drift component. The band-pass filter 192M1 is only required to be a band-pass filter having both a function of a low-pass filter that removes the high-frequency (first drive signal) component similarly to the low-pass filter 192 (see FIG. 8), and a function of a high-pass filter that causes the pressing signal to pass through and removes the drift component having a frequency lower than that of the pressing signal.

Figure 18:
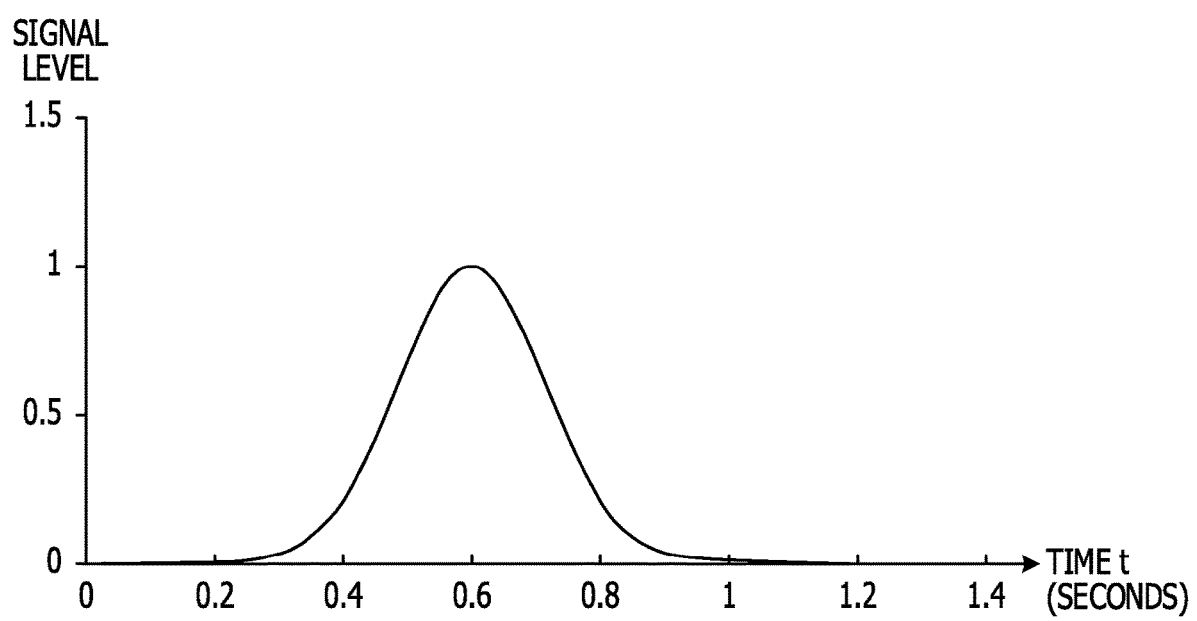
FIG. 18 is a diagram illustrating a pressing signal output from a band-pass filter.

FIG. 18 is a diagram illustrating a pressing signal output from the band-pass filter 192M1. The pressing signal illustrated in FIG. 18 has a waveform from which the drift component has been removed compared to the pressing signal illustrated in FIG. 11.

Furthermore, in the above, a mode has been described in which the detection circuit 190 includes the low-pass filter 192; however, in a case where the pressing determination can be performed without using the low-pass filter 192, the low-pass filter 192 does not have to be included.

Figure 19:
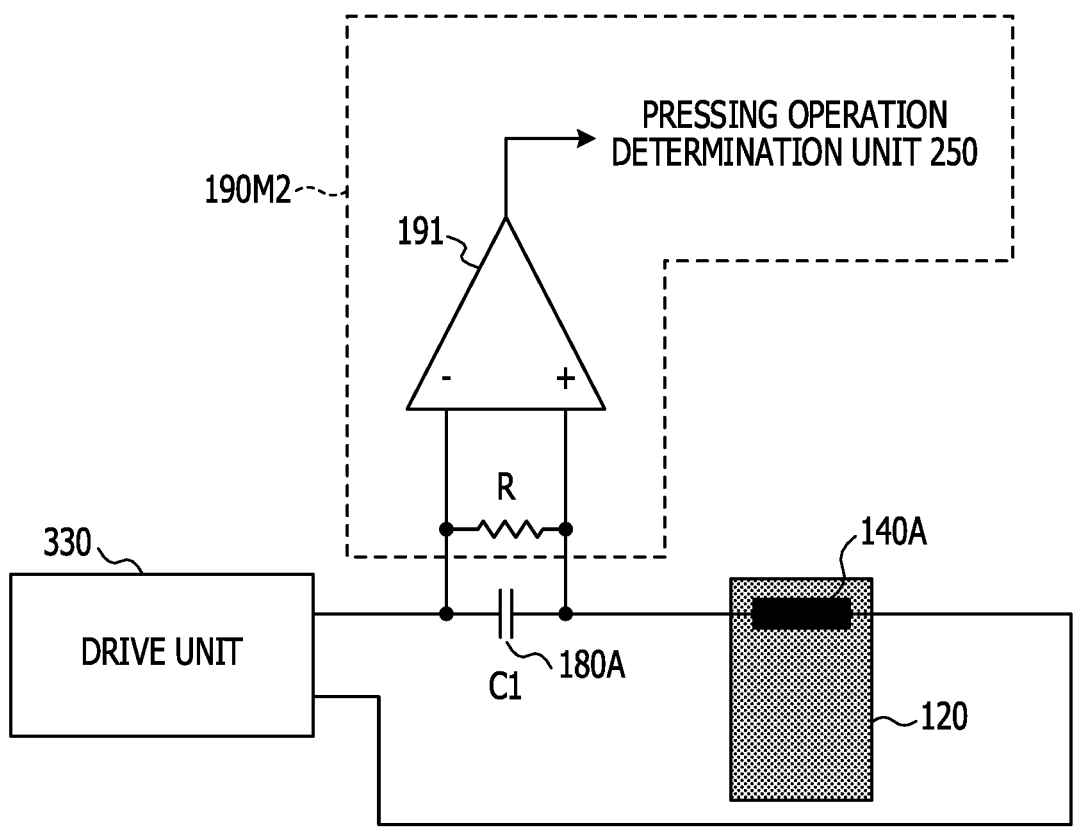
FIG. 19 is a diagram illustrating a second modification of the portion related to the determination of the pressing operation, in the electronic device.

FIG. 19 is a diagram illustrating a second modification of the portion related to the determination of the pressing operation, in the electronic device 100. In FIG. 19, a detection circuit 190M2 is provided instead of the detection circuit 190 illustrated in FIG. 8. The detection circuit 190M2 includes the differential amplifier 191 and does not include the low-pass filter 192 (see FIG. 8). In this case, for example, it is sufficient that the determination threshold value is set to 2.5 at the level of the vertical axis in FIG. 10.

Figure 20:
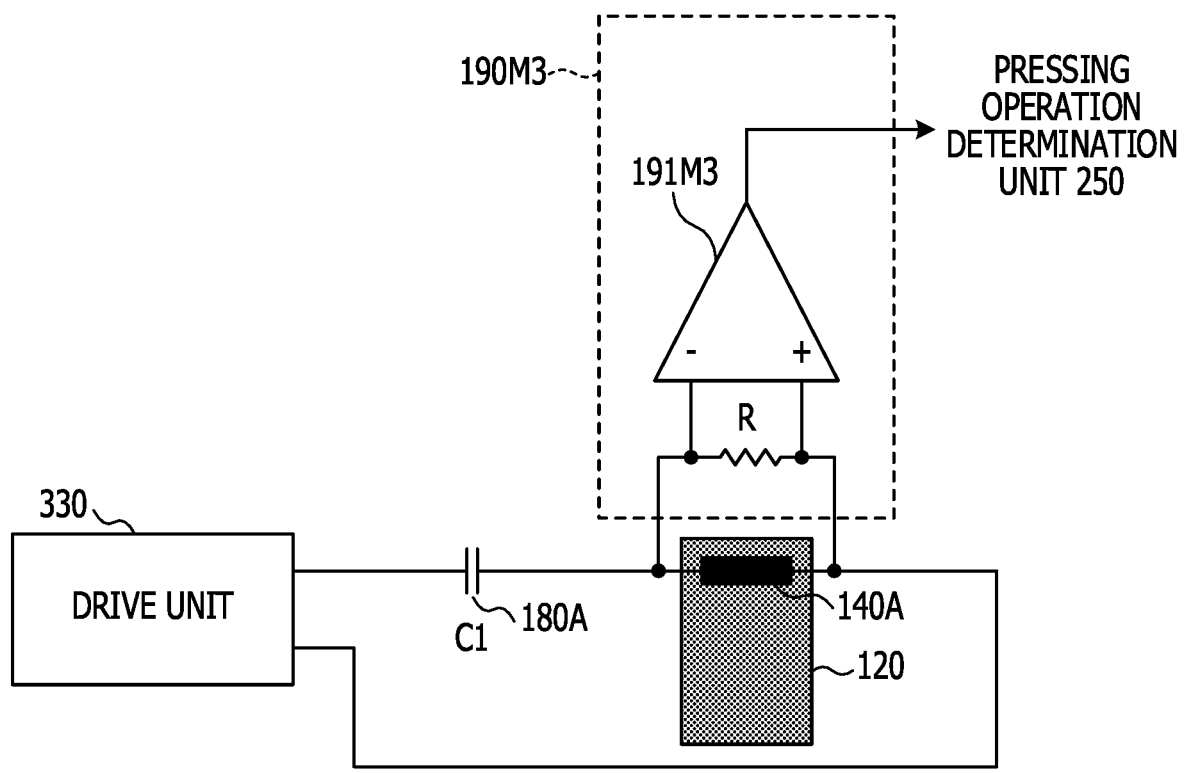
FIG. 20 is a diagram illustrating a third modification of the portion related to the determination of the pressing operation, in the electronic device.

FIG. 20 is a diagram illustrating a third modification of the portion related to the determination of the pressing operation, in the electronic device 100. In FIG. 20, a detection circuit 190M3 is provided instead of the detection circuit 190M2 illustrated in FIG. 19.

Similarly to the detection circuit 190M2, the detection circuit 190M3 includes a differential amplifier 191M3 and does not include the low-pass filter 192 (see FIG. 8). The differential amplifier 191M3 is connected to both ends of the vibrating element 140A, not the capacitor 180A, and detects the voltage V0 across the vibrating element 140A.

Since the closed circuit including the vibrating element 140A and the capacitor 180A is grounded, the following formula (3) is established, so that V0=−V1 is satisfied. For this reason, the detection circuit 190M3 can detect the pressing signal on which the first drive signal is superimposed, similarly to the detection circuit 190M2.

Next, with reference to FIGS. 21 to 24, a connection form will be described between the drive unit 330, the vibrating elements 140A and 140B or the vibrating element 140A, and the capacitors 180A and 180B or the capacitor 180A. FIGS. 21 to 24 are diagrams each illustrating the connection form of the portion related to the determination of the pressing operation.

Figure 21:
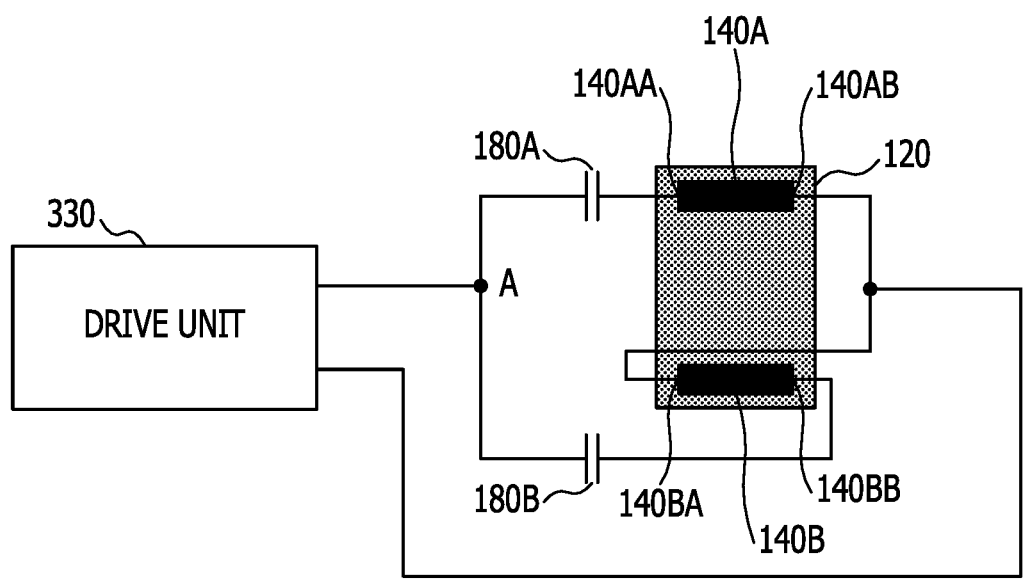
FIG. 21 is a diagram illustrating a connection form of the portion related to the determination of the pressing operation.

FIG. 21 illustrates a connection form in which the vibrating elements 140A and 140B are provided on the top panel 120, and the vibrating elements 140A and 140B are connected to the drive unit 330 via capacitors 180A and 180B, respectively. Such a connection form corresponds to a connection form between the vibrating elements 140A and 140B, the capacitors 180A and 180B, and the drive unit 330 illustrated in FIG. 6. Note that, in FIG. 8, only the vibrating element 140A and the capacitor 180A are illustrated for easy understanding.

In the electronic device 100 illustrated in FIG. 6, the portion where the vibrating element 140A is attached to the top panel 120 and the portion where the vibrating element 140B is attached to the top panel 120 are portions of antinodes of the natural vibration that vibrate in opposite phases, so that the vibrating element 140A and the vibrating element 140B are driven in opposite phases.

For this reason, as illustrated in FIG. 21, the vibrating element 140A and the vibrating element 140B are connected to each other in opposite polarities as follows. Here, the vibrating element 140A includes the electrodes 140AA and 140AB, and the vibrating element 140B includes electrodes 140BA and 140BB. The electrode 140AA and the electrode 140BA are electrodes having the same polarity, and the electrode 140AB and the electrode 140BB are electrodes having the same polarity.

In such a case, the electrode 140AA of the vibrating element 140A is connected to the drive unit 330 via the capacitor 180A, and the electrode 140AB is connected to the drive unit 330 and the electrode 140BA of the vibrating element 140B. Furthermore, the electrode 140BA of the vibrating element 140B is connected to the drive unit 330 and the electrode 140AB of the vibrating element 140A, and the electrode 140BB is connected to the drive unit 330 via the capacitor 180B.

In the connection form illustrated in FIG. 21, it is sufficient that both the capacitors 180A and 180B or both the vibrating elements 140A and 140B are connected to the detection circuit 190 (see FIG. 8), the detection circuit 190M1 (see FIG. 17), the detection circuit 190M2 (see FIG. 19), or the detection circuit 190M3 (see FIG. 20), and the voltage across the capacitor or the vibrating element is detected.

Note that, in a case where the vibrating elements 140A and 140B are connected to each other in opposite polarities as described above, instead of the capacitors 180A and 180B illustrated in FIG. 21, if a capacitor is provided between the drive unit 330 and a branch point A between the electrode 140AA of the vibrating element 140A and the electrode 140BB of the vibrating element 140B, signals having opposite polarities cancel each other, so that care must be taken in the position where the capacitor is provided.

Figure 22:
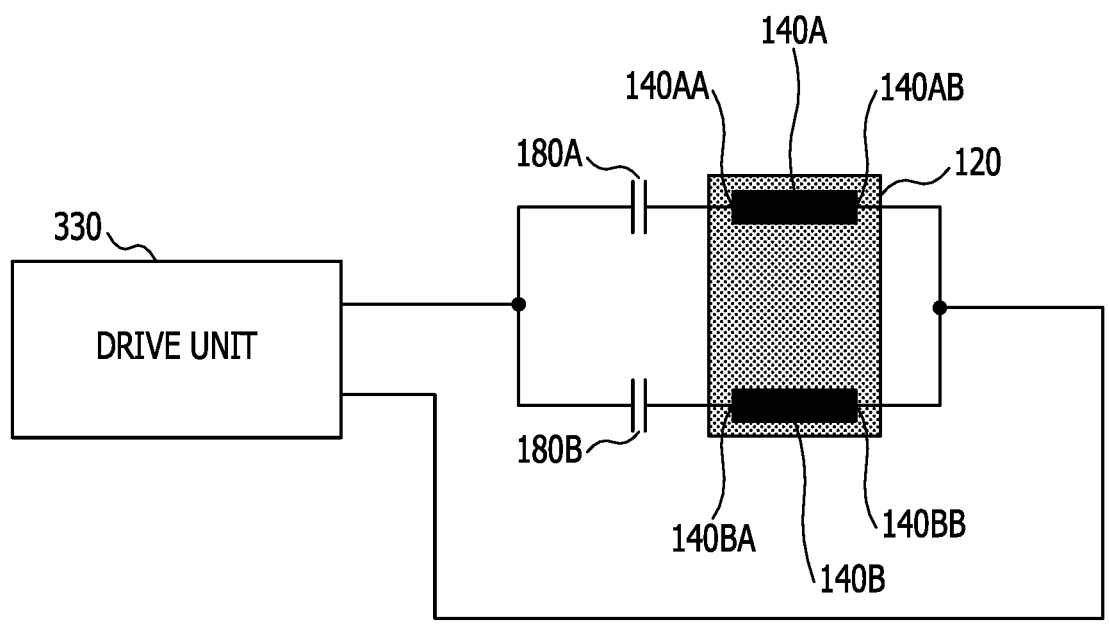
FIG. 22 is a diagram illustrating a connection form of the portion related to the determination of the pressing operation.

FIG. 22 illustrates a connection form in which the vibrating elements 140A and 140B are provided on the top panel 120, and the vibrating elements 140A and 140B are connected to the drive unit 330 via the capacitors 180A and 180B, respectively.

The connection form illustrated in FIG. 22 is a case where the portion where the vibrating element 140A is attached to the top panel 120 and the portion where the vibrating element 140B is attached to the top panel 120 are portions of antinodes of the natural vibration that vibrate in the same phase. In such a case, the vibrating element 140A and the vibrating element 140B are connected to each other with the same polarity and driven in the same phase.

In the connection form illustrated in FIG. 22, it is sufficient that both the capacitors 180A and 180B or both the vibrating elements 140A and 140B are connected to the detection circuit 190 (see FIG. 8), the detection circuit 190M1 (see FIG. 17), the detection circuit 190M2 (see FIG. 19), or the detection circuit 190M3 (see FIG. 20), and the voltage across the capacitor or the vibrating element is detected.

Figure 23:
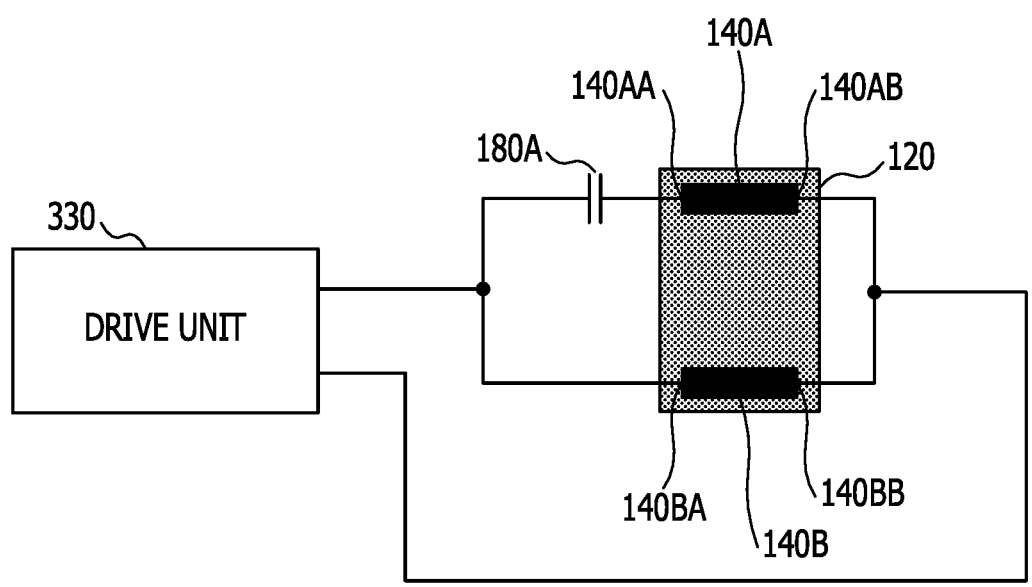
FIG. 23 is a diagram illustrating a connection form of the portion related to the determination of the pressing operation.

Furthermore, a connection form illustrated in FIG. 23 is a modification of the connection form illustrated in FIG. 22. As illustrated in FIG. 23, the connection form may be used in which the vibrating elements 140A and 140B are provided on the top panel 120, the vibrating element 140A is connected to the drive unit 330 via the capacitor 180A, and the vibrating element 140B is connected to the drive unit 330 without a capacitor.

In this case, it is sufficient that the capacitor 180A or the vibrating element 140A is connected to the detection circuit 190 (see FIG. 8), the detection circuit 190M1 (see FIG. 17), the detection circuit 190M2 (see FIG. 19), or the detection circuit 190M3 (see FIG. 20), and the voltage across the capacitor or the vibrating element is detected.

Figure 24:
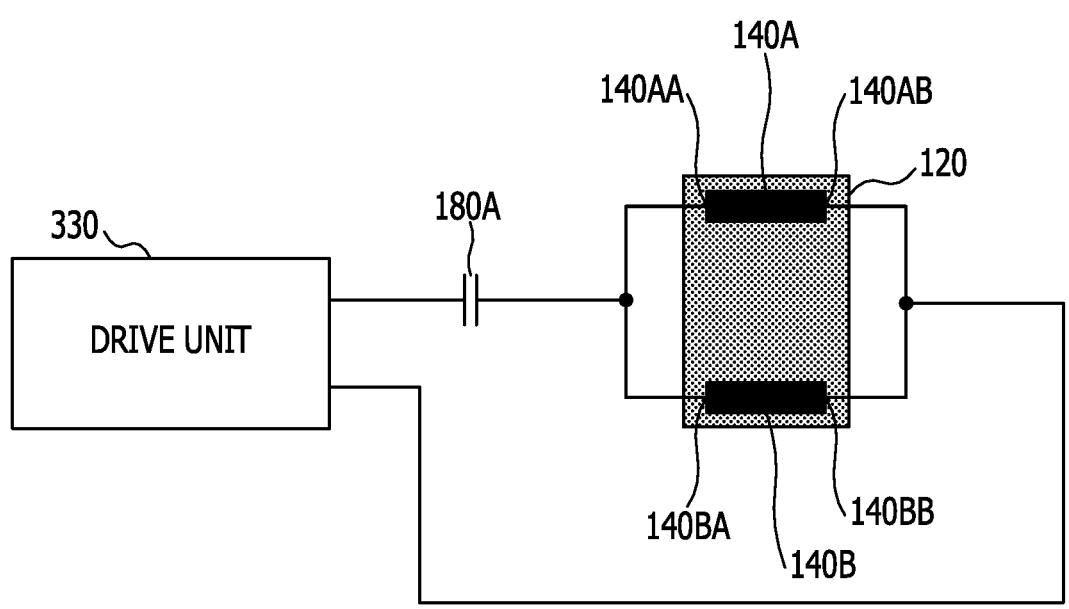
FIG. 24 is a diagram illustrating a connection form of the portion related to the determination of the pressing operation.

Furthermore, a connection form illustrated in FIG. 24 is a modification of the connection form illustrated in FIG. 23. As illustrated in FIG. 24, the vibrating elements 140A and 140B are provided on the top panel 120, and the vibrating elements 140A and 140B are connected to the drive unit 330 via the capacitor 180A.

In this case, it is sufficient that the capacitor 180A, the vibrating element 140A, or the vibrating element 140B is connected to the detection circuit 190 (see FIG. 8), the detection circuit 190M1 (see FIG. 17), the detection circuit 190M2 (see FIG. 19), or the detection circuit 190M3 (see FIG. 20), and the voltage across the capacitor or the vibrating element is detected.

Here, with reference to FIG. 25, a description will be given of a place where the electronic device 100 according to the embodiment can be arranged in the interior of a vehicle. The electronic device 100 may have a configuration not including the display panel 160. The electronic device 100 may be regarded as an input device.

Figure 25:
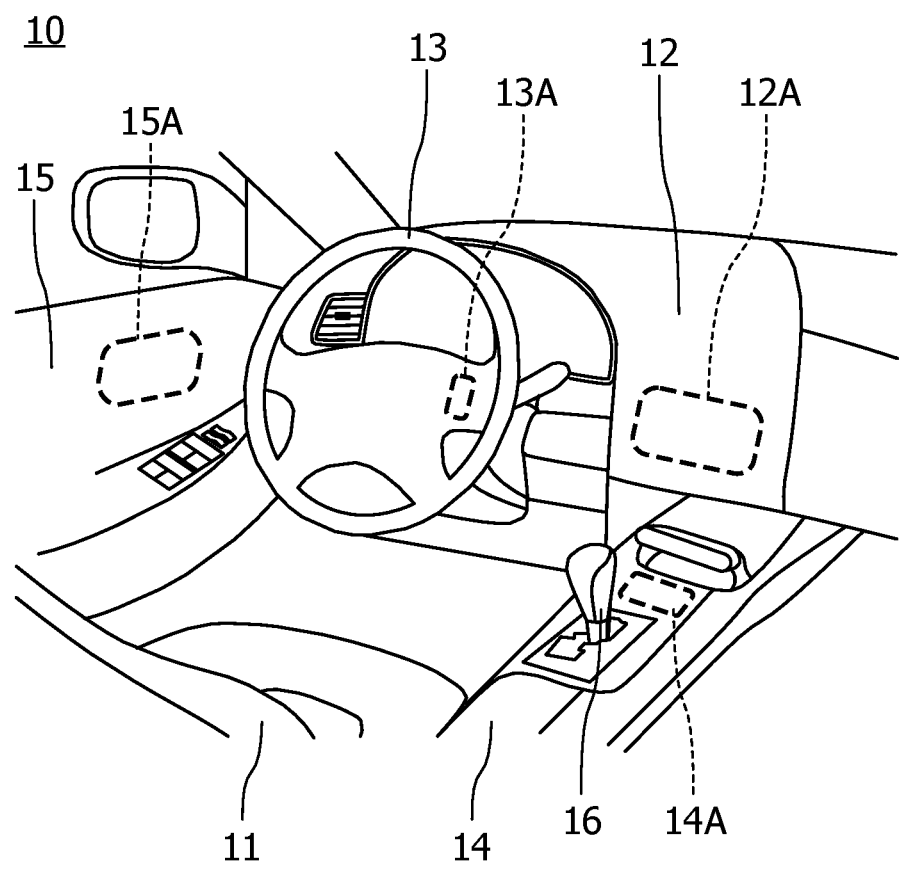
FIG. 25 is a diagram illustrating a state around a driver's seat of the interior of a vehicle.

FIG. 25 is a diagram illustrating a state around a driver's seat 11 of the interior of a vehicle 10. In the interior of the vehicle 10, the driver's seat 11, a dashboard 12, a steering wheel 13, a center console 14, a door lining 15, and the like are disposed. Note that, it is sufficient that the vehicle 10 is, for example, a hybrid vehicle (HV), an electric vehicle (EV), a gasoline engine vehicle, a diesel engine vehicle, a fuel cell vehicle (FCV), a hydrogen vehicle, or the like.

The electronic device 100 according to the embodiment can be disposed, for example, in a central portion 12A of the dashboard 12, a spoke portion 13A of the steering wheel 13, a periphery 14A of a shift lever 16 of the center console 14, a recess 15A of the door lining 15, and the like.

Furthermore, although not illustrated in FIG. 25, the electronic device 100 according to the embodiment may be provided outside the vehicle 10. For example, the electronic device 100 may be provided around a door handle and used as an operation unit of an electronic lock.

Figure 26:
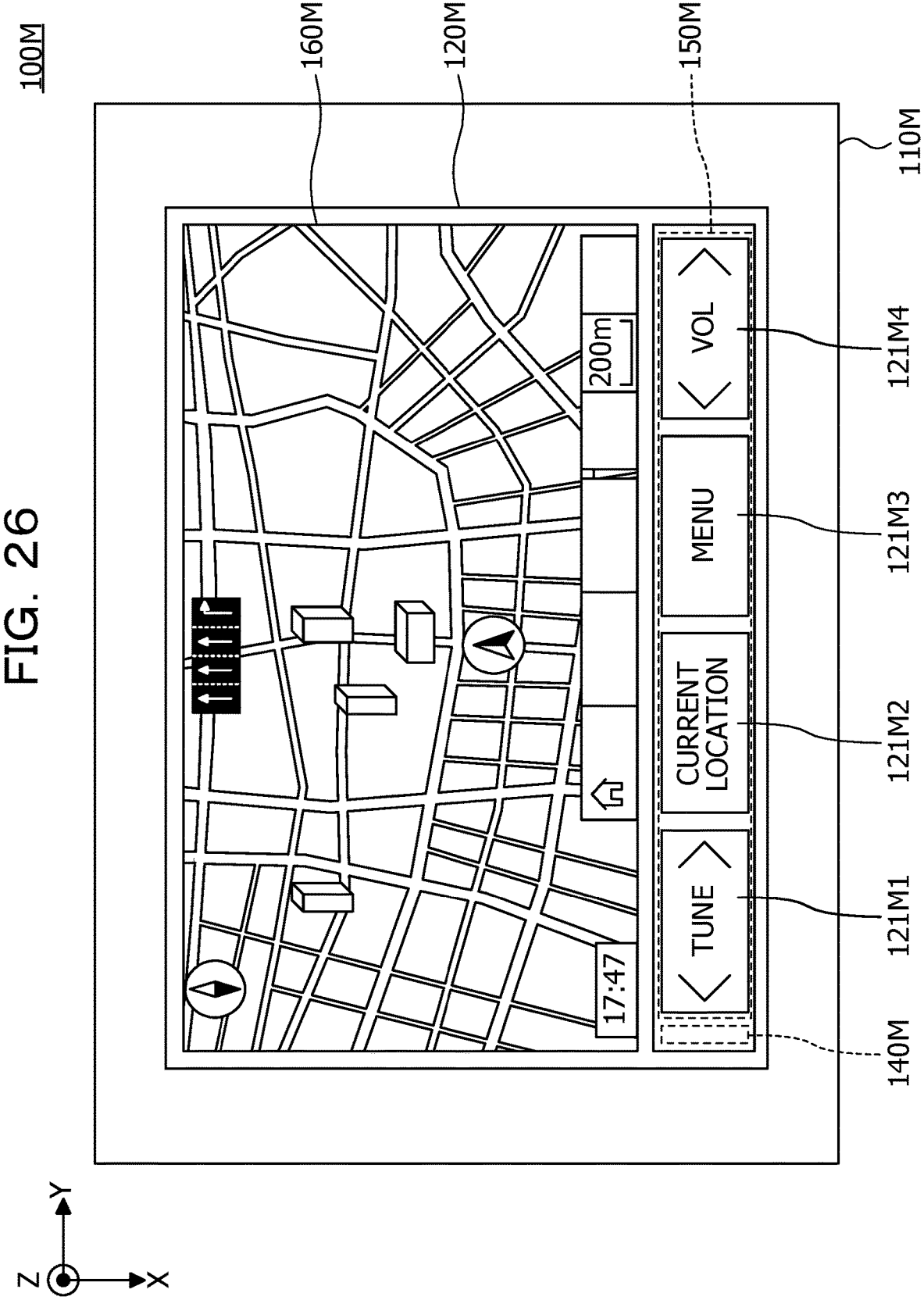
FIG. 26 is a plan view illustrating an electronic device according to a fourth modification.

FIG. 26 is a plan view illustrating an electronic device 100M according to a fourth modification. The electronic device 100M includes a housing 110M, a top panel 120M, a vibrating element 140M, a touch panel 150M, and a display panel 160M. The housing 110M, the top panel 120M, the vibrating element 140M, the touch panel 150M, and the display panel 160M respectively correspond to the housing 110, the top panel 120, the vibrating element 140A, the touch panel 150, and the display panel 160, and the sizes and the like are changed.

As illustrated in FIG. 26, a map is displayed on the display panel 160M. Furthermore, the touch panel 150M is disposed in an area including operation units 121M1, 121M2, 121M3, and 121M4 in a plan view. The vibrating element 140M is provided on the Y-axis negative direction side of the touch panel 150M in a plan view.

Characters, symbols, and the like of the operation units 121M1, 121M2, 121M3, and 121M4 are printed on the back surface of the top panel 120M. For this reason, the operation units 121M1, 121M2, 121M3, and 121M4 are visible even in a state in which the electronic device 100 is not operated.

For four areas on which the operation units 121M1, 121M2, 121M3, and 121M4 are printed, respective positions in the XY coordinate are determined and converted into data, like the area data f1 to f4 illustrated in FIG. 7. Furthermore, when the operational input is performed for the operation units 121M1, 121M2, 121M3, and 121M4, the vibrating element 140M is driven by the drive control unit 240 in respective predetermined vibration patterns.

It is sufficient that such predetermined vibration patterns are stored in the memory 260 in association with area data of the four areas on which the operation units 121M1, 121M2, 121M3, and 121M4 are printed, like that the vibration patterns P1 to P4 illustrated in FIG. 7 are associated with the area data f1 to f4.

Furthermore, in the electronic device 100M, even in a case where operational input is performed to a portion other than the operation units 121M1, 121M2, 121M3, and 121M4 in an area where the touch panel 150M is positioned in a plan view, the vibrating element 140M is driven by the drive control unit 240.

For this reason, it is sufficient that among the areas where the touch panel 150M is positioned in a plan view, the area data representing the areas other than the operation units 121M1, 121M2, 121M3, and 121M4 and the data representing the vibration patterns are also associated with each other, like the vibration patterns P1 to P4 and the area data f1 to f4 of the vibration control data illustrated in FIG. 7.

The operation unit 121M1 (TUNE) is an operation unit that selects a radio station. The operation unit 121M2 (current location) is an operation unit that selects display centered on the current location by navigation. The operation unit 121M3 (MENU) is an operation unit that causes the display panel 160M to display a menu screen. The operation unit 121M4 (VOL) is an operation unit that adjusts the volume.

Furthermore, when operational input is performed on the surface of the top panel 120M in the four areas on which the operation units 121M1, 121M2, 121M3, and 121M4 are printed, positional data output from the touch panel 150M is input to an electronic control unit (ECU) (electronic control device) of the vehicle. Therefore, it is possible to select a radio station, select a display centered on the current location by navigation, display the menu screen on the display panel 160M, and adjust the volume.

Note that, in the electronic device 100M, only a portion where the vibrating element 140M and the touch panel 150M exist in the X-axis direction (a portion corresponding to the operation area 120M2) may be regarded as the electronic device (or input device). In this case, a portion where the display panel 160M exists (display area 120M1) may be regarded as a display unit attached to the electronic device.

Furthermore, here, a mode will be described in which the characters, symbols, and the like of the operation units 121M1, 121M2, 121M3, and 121M4 are printed on the back surface of the top panel 120M; however, the characters, symbols, and the like of the operation units 121M1, 121M2, 121M3, and 121M4 may be printed on the front surface of the top panel 120M.

Furthermore, the characters, symbols, and the like of the operation units 121M1, 121M2, 121M3, and 121M4 may be represented by unevenness, by performing processing such as cutting on the surface of the top panel 120M. Furthermore, regarding the characters, symbols, and the like of the operation units 121M1, 121M2, 121M3, and 121M4, the characters, symbols, and the like are formed by processing such as printing or cutting on the front surface or back surface of the top panel 120M, and the characters, symbols, and the like may be displayed by light irradiation by a backlight or the like.

In such an electronic device 100M, in a case where pressing operation has been performed on the operation units 121M1, 121M2, 121M3, and 121M4 of the top panel 120M, the pressing operation can be detected.

Thus, it is possible to provide the electronic device 100M having a simple configuration, the method for controlling the electronic device 100M, and the control device having a simple configuration included in the electronic device 100M.

Figure 27:
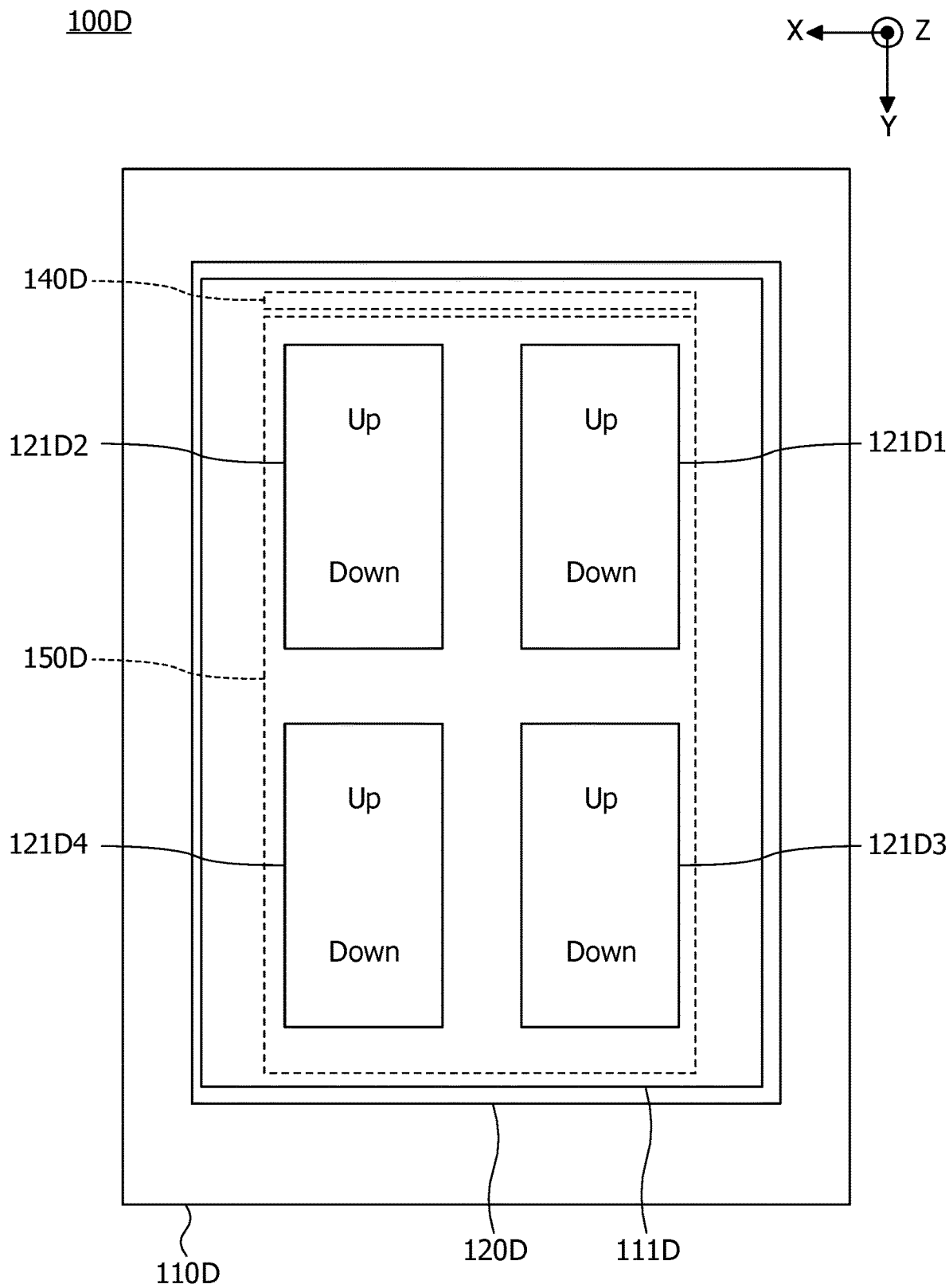
FIG. 27 is a plan view illustrating an operating state of the electronic device according to a fifth modification.

FIG. 27 is a plan view illustrating an operating state of an electronic device 100D according to a fifth modification. The electronic device 100D includes a housing 110D, a top panel 120D, a vibrating element 140D, a touch panel 150D, and a display panel 160D. The housing 110D, the top panel 120D, the vibrating element 140D, the touch panel 150D, and the display panel 160D respectively correspond to the housing 110, the top panel 120, the vibrating element 140A, the touch panel 150, and the display panel 160, and the sizes and the like are changed.

As illustrated in FIG. 27, operation units 121D1, 121D2, 121D3, and 121D4 are disposed in an area where the touch panel 150D is disposed.

The operation units 121D1, 121D2, 121D3, and 121D4 are printed on the back surface of the top panel 120D. For this reason, the operation units 121D1, 121D2, 121D3, and 121D4 are visible even in a state in which the electronic device 100 is not operated.

For four areas on which the operation units 121D1, 121D2, 121D3, and 121D4 are printed, respective positions in the XY coordinate are determined and converted into data, like the area data f1 to f4 illustrated in FIG. 7. Furthermore, when the operational input is performed for the operation units 121D1, 121D2, 121D3, and 121D4, the vibrating element 140D is driven by the drive control unit 240 in respective predetermined vibration patterns.

It is sufficient that such predetermined vibration patterns are stored in the memory 260 in association with area data of the four areas on which the operation units 121D1, 121D2, 121D3, and 121D4 are printed, like that the vibration patterns P1 to P4 illustrated in FIG. 7 are associated with the area data f1 to f4. Note that, the vibration patterns P1 to P4 may all be the same.

Note that, in the electronic device 100D, even in a case where operational input is performed to a portion other than the operation units 121D1, 121D2, 121D3, and 121D4 in an area where the touch panel 150D is positioned in a plan view, the vibrating element 140D may be driven by the drive control unit 240.

In this case, it is sufficient that among the areas where the touch panel 150D is positioned in a plan view, the area data representing the areas other than the operation units 121D1, 121D2, 121D3, and 121D4 and the data representing the vibration patterns are also associated with each other, like the vibration patterns P1 to P4 and the area data f1 to f4 of the vibration control data illustrated in FIG. 7.

The operation units 121D1, 121D2, 121D3, and 121D4 are operation units that perform opening and closing operations on a right front window, a left front window, a right rear window, and a left rear window, respectively.

Furthermore, when operational input is performed on the surface of the top panel 120D in the four areas on which the operation units 121D1, 121D2, 121D3, and 121D4 are printed, positional data output from the touch panel 150D is input to an ECU 400. Therefore, the opening and closing operations can be respectively performed on the right front window, the left front window, the right rear window, and the left rear window.

As described above, according to the electronic device 100D, the natural vibration in the ultrasonic band of the top panel 120D is generated to change the dynamic friction force applied to the user's fingertip, so that a favorable tactile sensation can be provided to the user who operates the operation units 121D1, 121D2, 121D3, and 121D4.

Furthermore, the electronic device 100D stops the vibration of the vibrating element 140D for a fixed period at boundaries of the operation units 121D1, 121D2, 121D3, and 121D4, whereby the user can perceive the locations of the operation units 121D1, 121D2, 121D3, and 121D4 with the tactile sensation of existence of a protrusion. Therefore, the electronic device 100D is very convenient.

In such an electronic device 100D, in a case where pressing operation has been performed on the operation units 121D1, 121D2, 121D3, and 121D4 of the top panel 120D, the pressing operation can be detected.

Thus, it is possible to provide the electronic device 100D having a simple configuration, the method for controlling the electronic device 100D, and the control device having a simple configuration included in the electronic device 100D.

Although the control device, the electronic device, and the method for controlling the electronic device according to the exemplary embodiment have been described above, the present embodiment is not limited to the embodiment specifically disclosed, and various modifications and changes can be made without departing from the scope of the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A control circuitry that controls an electronic device including a top panel having an operation surface, a driver integrated circuit that detects a position of operational input performed on the operation surface, and a first piezoelectric element that generates vibration in the top panel, the control circuitry comprising:
   a first processor that outputs a first drive signal to the first piezoelectric element to drive the first piezoelectric element;
   a first capacitor having a first electrode and a second electrode and connected in series between the first piezoelectric element and the first processor; and
   a first differential amplifier that includes a first input terminal and a second input terminal and inputs a first voltage that is a voltage across the first capacitor or the first piezoelectric element,
   wherein the first electrode is coupled to the first piezoelectric element, and the second electrode is coupled to the first processor,
   the first input terminal is coupled to a node between the first piezoelectric element and the first capacitor,
   when the first voltage is the voltage across the first capacitor, the second input terminal is coupled to a node between the first capacitor and the first processor,
   when the first voltage is the voltage across the first piezoelectric element, the second input terminal is coupled to a node between the first piezoelectric element and the first processor, and
   the first processor is configured to determine whether a pressing operation to the top panel has been performed based on the first voltage inputted by the first differential amplifier,
   wherein the first processor is configured to determine whether the pressing operation has been performed while the first piezoelectric element is driven by the first drive signal.

2. The control circuitry according to claim 1, wherein the first drive signal is a drive signal that vibrates the first piezoelectric element with a constant amplitude when the position of the operational input detected by the driver integrated circuit is stopped, and
   the first processor is configured to determine whether the pressing operation has been performed when the first piezoelectric element is driven by the first drive signal having the constant amplitude.

3. The control circuitry according to claim 1, wherein the first drive signal is a drive signal that stops the first piezoelectric element when the position of the operational input detected by the driver integrated circuit is stopped, and
   the first processor is configured to determine whether the pressing operation has been performed when the first piezoelectric element is stopped.

4. The control circuitry according to claim 1, further comprising
   a low-pass filter that is provided between the first differential amplifier and the first processor and configured to transmit a voltage component of a low frequency band lower than or equal to a predetermined frequency of the first voltage to the first processor.

5. The control circuitry according to claim 4, wherein the voltage across the first capacitor has a signal waveform in which the first drive signal and a voltage signal generated by pressing are superimposed on each other, and the low-pass filter is configured to eliminate the first drive signal and transmit the voltage signal generated by the pressing operation to the first processor.

6. The control circuitry according to claim 1, further comprising
   a band-pass filter that is provided between the first differential amplifier and the first processor and configured to transmit a voltage component of a frequency band higher than or equal to a first frequency and lower than or equal to a second frequency of the first voltage to the first processor.

7. The control circuitry according to claim 1,
   wherein the first differential amplifier includes a non-inverting input terminal and an inverting input terminal, and
   the non-inverting input terminal and the inverting input terminal are coupled to both ends of the first capacitor or the first piezoelectric element.

8. The control circuitry according to claim 1,
   wherein the first drive signal is applied to the first piezoelectric element from the first processor via the first capacitor.

9. The control circuitry according to claim 1,
   wherein the first differential amplifier is coupled in parallel to the first capacitor or the first piezoelectric element and configured to input the first voltage that is a potential difference between the first input terminal and the second input terminal.

10. The control circuitry according to claim 9,
    when the first differential amplifier is coupled in parallel to the first capacitor, the second input terminal is coupled to the node between the first capacitor and the first processor, and
    when the first differential amplifier is coupled in parallel to the first piezoelectric element, the second input terminal is coupled to the node between the first piezoelectric element and the first processor.

11. The control circuitry according to claim 1, wherein the first processor is configured to:
    read a voltage value input from the first differential amplifier and positional data input from the driver integrated circuit,
    read multiple determination threshold values around coordinates represented by the positional data from a database of determination threshold values,
    calculate a determination threshold value at the coordinates represented by the positional data by performing interpolation processing, and
    determine that the pressing operation to the top panel has been performed when it is determined that the voltage value is greater than or equal to the calculated determination threshold value.

12. The control circuitry according to claim 11,
    wherein the first processor is configured to repeatedly execute, every predetermined system cycle while power of the electronic device is turned on, a processing from reading the voltage value input from the first differential amplifier to determining whether the pressing operation to the top panel has been performed.

13. An electronic device, comprising:
    a top panel having an operation surface;
    a driver integrated circuit that detects a position of operational input performed on the operation surface;
    a first piezoelectric element that generates vibration in the top panel;

a first processor that outputs a first drive signal to the first piezoelectric element to drive the first piezoelectric element;

a first capacitor having a first electrode and a second electrode and connected in series between the first piezoelectric element and the first processor; and a first differential amplifier that includes a first input terminal and a second input terminal and inputs a first voltage that is a voltage across the first capacitor or the first piezoelectric element, wherein the first electrode is coupled to the first piezoelectric element, and the second electrode is coupled to the first processor, the first input terminal is coupled to a node between the first piezoelectric element and the first capacitor, when the first voltage is the voltage across the first capacitor, the second input terminal is coupled to a node between the first capacitor and the first processor, when the first voltage is the voltage across the first piezoelectric element, the second input terminal is coupled to a node between the first piezoelectric element and the first processor, and the first processor is configured to determine whether a pressing operation to the top panel has been performed based on the first voltage inputted by the first differential amplifier, wherein the first processor is configured to determine whether the pressing operation has been performed while the first piezoelectric element is driven by the first drive signal.

14. A method executed by a control circuitry for controlling an electronic device, the electronic device including a top panel having an operation surface, a driver integrated circuit that detects a position of operational input performed on the operation surface, and a first piezoelectric element that generates vibration in the top panel, the control circuitry including a first processor that outputs a first drive signal to the first piezoelectric element to drive the first piezoelectric element, a first capacitor having a first electrode and a second electrode and connected in series between the first piezoelectric element and the first processor, and a first differential amplifier that includes a first input terminal and a second input terminal, the control method comprising:

inputting, by the first differential amplifier, a first voltage that is a voltage across the first capacitor or the first piezoelectric element, and determining, by the first processor, whether a pressing operation to the top panel has been performed based on the inputted first voltage, wherein the first electrode is coupled to the first piezoelectric element, and the second electrode is coupled to the first processor, the first input terminal is coupled to a node between the first piezoelectric element and the first capacitor, when the first voltage is the voltage across the first capacitor, the second input terminal is coupled to a node between the first capacitor and the first processor, and when the first voltage is the voltage across the first piezoelectric element, the second input terminal is coupled to a node between the first piezoelectric element and the first processor, wherein the determining includes determining, by the first processor, whether the pressing operation has been performed during the first piezoelectric element is driven by the first drive signal.

15. The method according to claim 14, wherein the determining includes: reading, by the first processor, a voltage value input from the first differential amplifier and positional data input from the driver integrated circuit, reading, by the first processor, multiple determination threshold values around coordinates represented by the positional data from a database of determination threshold values, calculating, by the first processor, a determination threshold value at the coordinates represented by the positional data by performing interpolation processing, and determining, by the first processor, that the pressing operation to the top panel has been performed when it is determined that the voltage value is greater than or equal to the calculated determination threshold value.

* * * * *